(12) United States Patent
Lassalle-Balier et al.

(10) Patent No.: US 11,327,127 B2
(45) Date of Patent: May 10, 2022

(54) MAGNETIC FIELD SENSOR WITH REDUCED INFLUENCE OF EXTERNAL STRAY MAGNETIC FIELDS

(71) Applicant: Allegro MicroSystems, LLC, Manchester, NH (US)

(72) Inventors: Rémy Lassalle-Balier, Bures sur Yvette (FR); Maxime Rioult, Massy (FR); Jean-Michel Daga, Aix en Provence (FR)

(73) Assignee: Allegro MicroSystems, LLC, Manchester, NH (US)

( * ) Notice: Subject to any disclaimer, the term of this patent is extended or adjusted under 35 U.S.C. 154(b) by 388 days.

(21) Appl. No.: 16/507,560

(22) Filed: Jul. 10, 2019

(65) Prior Publication Data
US 2021/0011096 A1 Jan. 14, 2021

(51) Int. Cl.
*G01R 33/00* (2006.01)
*G01D 5/14* (2006.01)

(52) U.S. Cl.
CPC ......... *G01R 33/0094* (2013.01); *G01D 5/145* (2013.01)

(58) Field of Classification Search
CPC .......................... G01R 33/0094; G01D 5/145
See application file for complete search history.

(56) References Cited

U.S. PATENT DOCUMENTS

| | | | |
|---|---|---|---|
| 5,047,716 A | 9/1991 | Katagiri | |
| 5,327,077 A | 7/1994 | Honda | |
| 5,841,276 A | 11/1998 | Makino et al. | |
| 9,719,806 B2 | 8/2017 | Foletto et al. | |
| 9,823,092 B2 | 11/2017 | David et al. | |
| 10,151,652 B2 * | 12/2018 | Gie ibl .................. | G01R 33/02 |
| 10,254,303 B2 * | 4/2019 | Grambichler ...... | G01D 5/24438 |
| 10,823,586 B2 | 11/2020 | Eagen et al. | |
| 2004/0263155 A1 | 12/2004 | Schroeder et al. | |
| 2009/0102460 A1 | 4/2009 | Schott et al. | |
| 2009/0206827 A1 | 8/2009 | Aimuta et al. | |
| 2016/0123768 A1 | 5/2016 | Foletto et al. | |

(Continued)

FOREIGN PATENT DOCUMENTS

| | | |
|---|---|---|
| DE | 102015218855 A1 | 3/2017 |
| EP | 2330389 A2 | 6/2011 |

(Continued)

OTHER PUBLICATIONS

Search Report and Written Opinion dated Dec. 14, 2020 for PCT Application No. PCT/US2020/038026; 28 pages.

(Continued)

*Primary Examiner* — Reena Aurora
(74) *Attorney, Agent, or Firm* — Daly, Crowley, Mofford & Durkee, LLP

(57) ABSTRACT

A magnetic field sensor responsive to a movement of a target object can include a plurality of magnetoresistance elements arranged in a line and having a span according to y(1−1/x), where y is equal a full spatial period of the target object and where x is equal to a total quantity of magnetoresistance elements in the plurality of magnetoresistance elements. The plurality of magnetic field sensing elements is operable to generate a signal that is substantially not responsive to the movement of the target object but is responsive to stray external magnetic fields.

28 Claims, 18 Drawing Sheets

(56) References Cited

U.S. PATENT DOCUMENTS

2017/0284830 A1    10/2017  Kusumi et al.
2018/0340986 A1*   11/2018  Latham .................... G01D 5/14
2021/0011097 A1*   1/2021   David .................. G01R 33/072

FOREIGN PATENT DOCUMENTS

JP      2006023179 A    1/2006
WO      WO 9953266 A1   10/1999

OTHER PUBLICATIONS

Invitation to Pay Additional Fees and Partial Search Report dated Oct. 1, 2020 for PCT Application No. PCT/US2020/038026; 15 pages.
International Preliminary Reporting on Patentability dated Jan. 20, 2022 for PCT Application No. PCT/US2020/038026; 19 pages.

* cited by examiner

MAGNETIC FIELD SENSOR WITH REDUCED INFLUENCE OF EXTERNAL STRAY MAGNETIC FIELDS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and, more particularly, to a magnetic field sensor with reduced influence of stray, unwanted, magnetic fields.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a semiconductor magnetoresistance element such as Indium Antimonide (InSb), a giant magnetoresistance (GMR) element, an anisotropic magnetoresistance element (AMR), and a tunneling magnetoresistance (TMR) element, also called a magnetic tunnel junction (MTJ) element.

Of these magnetoresistance elements, the GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" relative to another layer so-called "reference layer." The free layer and the reference layer are described more fully below.

The magnetoresistances element may be used as a single element or, alternatively, may be used as two or more magnetoresistance elements arranged in various configurations, e.g., a half bridge or full (Wheatstone) bridge.

As used herein, the term "magnetic field sensor" is used to describe a circuit that uses one or more magnetic field sensing elements, generally in combination with other circuits. In a typical magnetic field sensor, the magnetic field sensing element and the other circuits can be integrated upon a common substrate, for example, a semiconductor substrate. In some embodiments, the magnetic field sensor can also include a lead frame and packaging.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field. The parameters also include offset, which describes and output from the magnetic field sensing element that is not indicative of zero magnetic field when the magnetic field sensor experiences a zero magnetic field.

GMR and TMR elements are known to have a relatively high sensitivity, compared, for example, to Hall effect elements. Thus, a current sensor that uses GMR or TMR elements can sense smaller currents than can a current sensor that uses Hall effect elements.

TMR elements are known to have a higher sensitivity than GMR elements, but at the expense of higher noise at low frequencies.

Magnetoresistance elements are formed as a plurality of specialized layers disposed over a surface of a semiconductor substrate, and in particular, over an oxide or protection layer over a semiconductor substrate. Under the oxide layer can be various semiconducting electronic structures, e.g., transistors, which can be diffused downward into the semiconductor substrate.

Magnetic field sensors can be undesirably influenced by stray magnetic fields that originate outside of the magnetic field sensors, and which cause errors in that which the magnetic field sensors attempt to measure.

It would be desirable to provide a magnetic field sensor for which the influence of stray magnetic fields is reduced. It would be particularly desirable to provide a magnetic field sensor that uses magnetoresistance elements or vertical Hall elements and for which the influence of stray magnetic fields is reduced.

SUMMARY

The present invention provides a magnetic field sensor for which the influence of stray magnetic fields is reduced. The present invention can provide a magnetic field sensor that uses magnetoresistance elements or vertical Hall elements and for which the influence of stray magnetic fields is reduced.

In accordance with an example useful for understanding an aspect of the present invention, a magnetic field sensor is responsive to a target object having a plurality of target features arranged in a periodic pattern, the periodic pattern having a spatial period with a width y, the target object capable of moving such that the target features move along a movement direction relative to the magnetic field sensor. The magnetic field sensor includes a substrate having a surface; and a first plurality of magnetic field sensing elements disposed upon the substrate, the first plurality of magnetic field sensing elements comprising x magnetic field sensing elements, each having a respective maximum response axis parallel to a common axis and parallel to the surface of the substrate, the first plurality of magnetic field sensing elements arranged in a line parallel to the movement direction, wherein a distance between centers of outer ones of the first plurality of magnetic field sensing elements is $y(1-1/x)$, wherein the first plurality of magnetic field sensing elements is electrically coupled in a single series arrangement resulting in a series string signal.

In accordance with another example useful for understanding another aspect of the present invention, a magnetic field sensor is responsive to a target object having a plurality of target features arranged in a periodic pattern, the periodic pattern having a spatial period, the target object capable of moving such that the target features move along a movement direction relative to the magnetic field sensor. The magnetic field sensor includes a substrate having a surface. The magnetic field sensor further includes a first plurality of magnetic field sensing elements disposed upon the substrate, a first one of the first plurality of magnetic field sensing elements having a first reference layer with a first magnetic direction, a second one of the first plurality of magnetic field sensing elements having a second magnetic layer with a second magnetic direction orthogonal to the first magnetic direction, a third one of the first plurality of magnetic field sensing elements having a third reference layer with a third magnetic direction opposite to the first magnetic direction, and a fourth one of the first plurality of magnetic field sensing elements having a fourth reference layer with a fourth magnetic direction opposite to the second magnetic direction, the first plurality of magnetic field sensing elements arranged in a first line perpendicular to the movement direction. The magnetic field sensor further includes a second plurality of magnetic field sensing elements disposed upon the substrate, a first one of the second plurality of magnetic field sensing elements having a fifth reference layer with a fifth magnetic direction, a second one of the second plurality of magnetic field sensing elements having a sixth magnetic layer with a sixth magnetic direction orthogonal to the fifth magnetic direction, a third one of the second plurality of magnetic field sensing elements having a seventh reference layer with a seventh magnetic direction opposite to the fifth magnetic direction, and an fourth one of the second plurality of magnetic field sensing elements having an eighth reference layer with an eighth magnetic direction opposite to the sixth magnetic direction, the second plurality of magnetic field sensing elements arranged in a second line perpendicular to the movement direction and parallel to the first line.

In accordance with another example useful for understanding another aspect of the present invention, a magnetic field sensor is responsive to a target object having a plurality of target features arranged in a periodic pattern, the periodic pattern having a spatial period, the target object capable of moving such that the target features move along a movement direction relative to the magnetic field sensor. The magnetic field sensor includes a substrate having a surface; and three or more magnetic field sensing elements disposed upon the substrate, each having a respective reference layer with a respective reference magnetic direction, the reference magnetic directions of the three or more magnetic field sensing elements parallel to a common axis and parallel to the surface of the substrate, the three or more magnetic field sensing elements arranged in a line parallel to the movement direction, wherein the three or more magnetic field sensing elements are electrically energized in a sequential pattern resulting in separate time multiplexed signals representative of sequential signals generated by the three or more magnetic field sensing elements.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
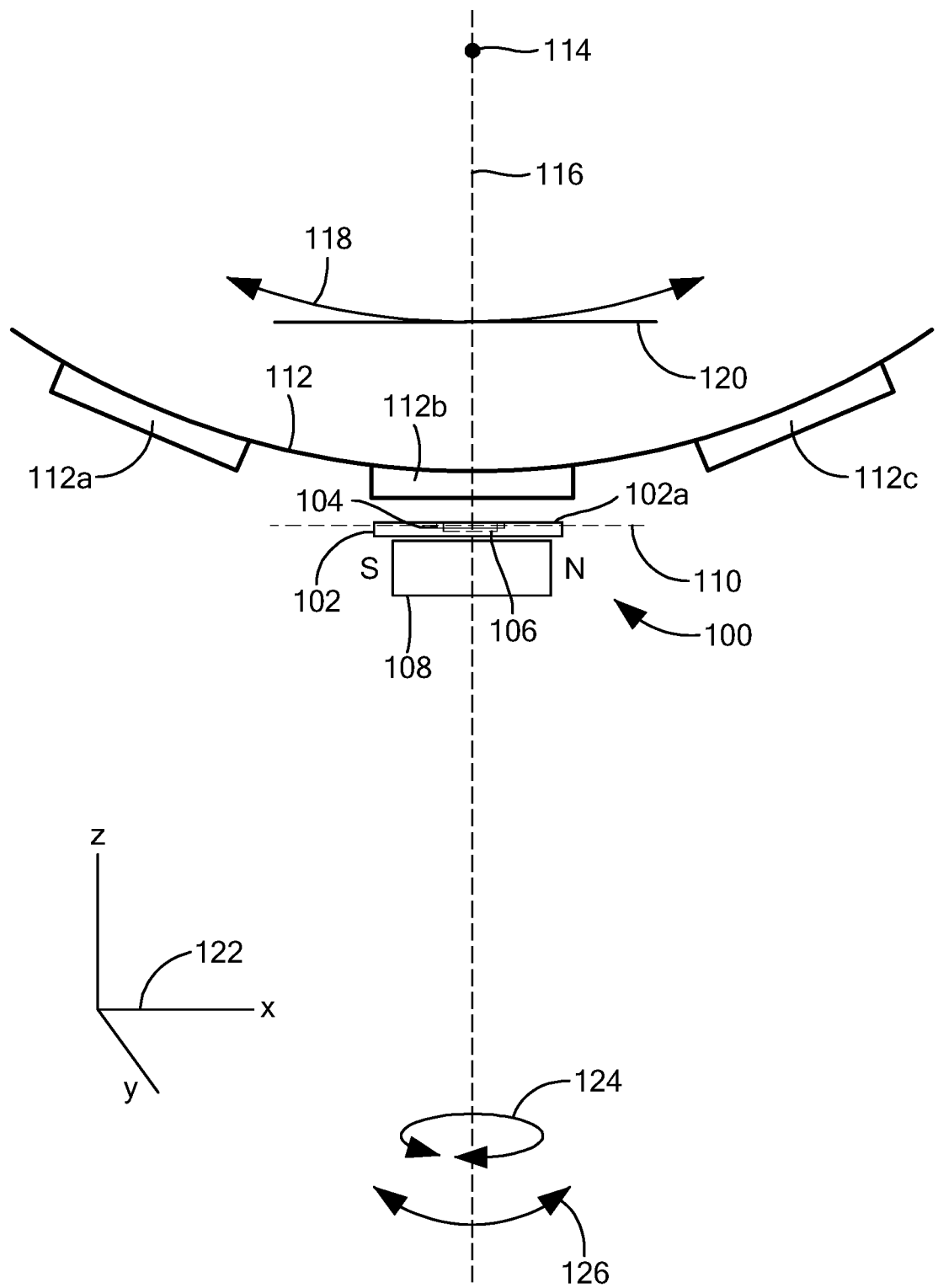
FIG. 1 is a side view of a magnetic field sensor having a back-biasing magnet, the magnetic field sensor proximate to a rotating ferromagnetic gear, the magnetic field sensor having magnetic field sensing elements and an electronic circuit.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type I-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and"perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "amplifier" is used to describe a circuit element with a gain greater than one, less than one, or equal to one.

While magnetic field sensing elements are shown by indicated symbols to be TMR elements in some figures herein and GMR elements in other figures herein, in some embodiments, the TMR and GMR elements can be replace by another type of magnetic field sensing elements e.g., TMR replaced by GMR or vice versa, replaced by AMR elements, or replaced by vertical Hall elements.

Referring now to FIG. 1, an illustrative magnetic field sensor 100 can include magnetic field sensing elements 104, and an electronic circuit 106, all disposed upon a first surface 102a of a substrate 102, for example, a semiconductor substrate. The magnetic field sensing elements 104 can be disposed along one or more straight lines 110 parallel to the surface 102a. The surface 102a can be disposed substantially in an x-y plane within x-y-z coordinates 122.

The magnetic field sensor 100 can include a permanent magnet 108 for generating a magnetic field, fluctuations of which can be sensed by the magnetic field sensing elements in response to motion of a ferromagnetic target object 112, e.g., a gear, operable to rotate about a rotation axis 114, with a direction of rotation indicated by a line 118. The line 118 can have a tangent 120. A line 116, substantially parallel to a z axis, can pass through the rotation axis 114 and can be perpendicular to the first surface 102a of the substrate 102. The tangent 120 can be substantially perpendicular to the line 116. This arrangement provides a so-called "back-biased" arrangement.

A line passing through the north and south poles of the magnet 108 can be substantially parallel to the line 116 perpendicular to the surface 102a. The magnetic field sensor 100 can be tilted in directions indicated by a line 126 through at least +/−twenty degrees with only a small impact on performance of the magnetic field sensor 100. The magnetic field sensor 100 can be rotated in a direction of a line 124 to a position one hundred eighty degrees relative to the position shown with no impact on behavior of the magnetic field sensor 100.

Figure 2:
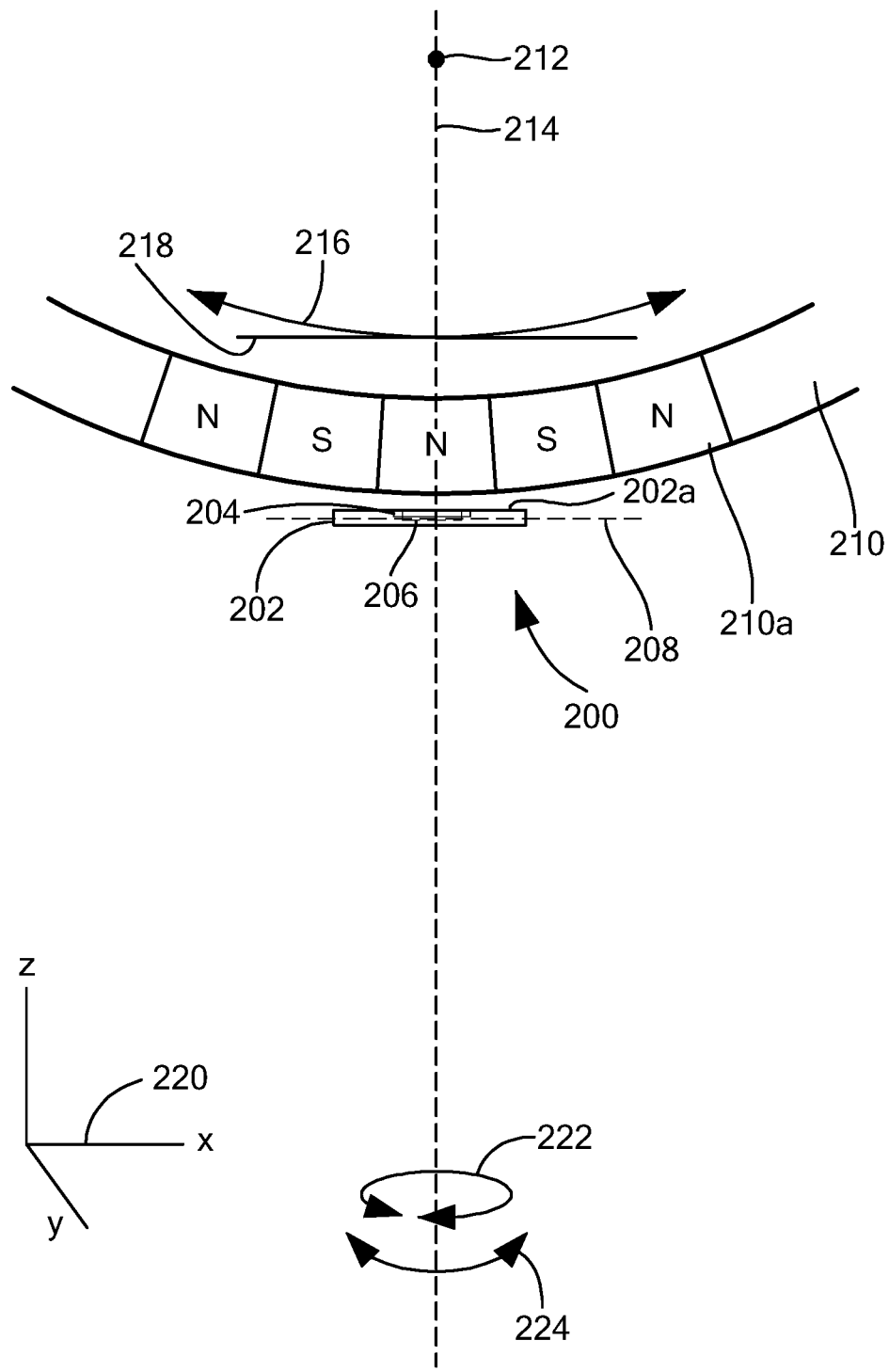
FIG. 2 is a side view of a magnetic field sensor having no back-biasing magnet, the magnetic field sensor proximate to a rotating ring magnet, the magnetic field sensor having magnetic field sensing elements and an electronic circuit.

Referring now to FIG. 2, another illustrative magnetic field sensor 200 can include magnetic field sensing elements 204 and an electronic circuit 206 all disposed upon a first surface 202a of a substrate 202, for example, a semiconductor substrate. The magnetic field sensing elements 204 can be disposed along one or more straight lines 208 parallel to the surface 202a. The surface 202a can be disposed substantially in an x-y plane within x-y-z coordinates 220.

Unlike the magnetic field sensor 100 of FIG. 1, the magnetic field sensor 200 does not include a permanent magnet. Instead, the magnetic field sensor 200 can sense magnetic field fluctuations in response to motion of a ferromagnetic target object 210, e.g., a ring magnet, operable to rotate about a rotation axis 212, with a direction of rotation indicated by a line 216. The line 216 can have a tangent 218. A line 214, substantially parallel to a z axis, can pass through the rotation axis 212 and can be perpendicular to the first surface 202a of the substrate 202. The tangent 218 can be substantially perpendicular to the line 214.

The magnetic field sensor 200 can be tilted in directions indicated by a line 224 through at least +/−twenty degrees with only a small impact on performance of the magnetic field sensor 200. The magnetic field sensor 200 can be rotated in a direction of a line 222 to a position one hundred eighty degrees relative to the position shown with no impact on behavior of the magnetic field sensor 200.

Figure 3:
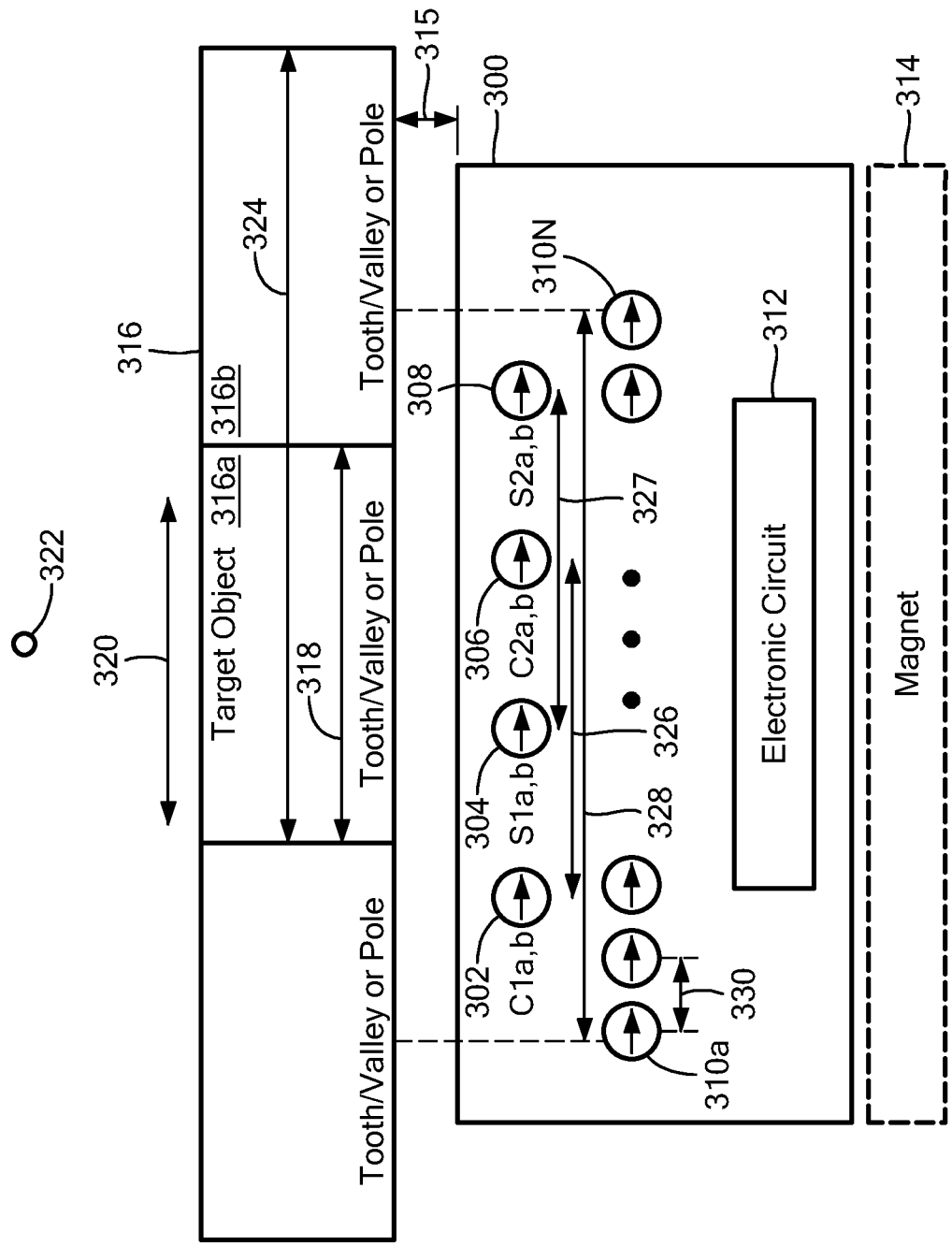
FIG. 3 is a top view of a magnetic field sensor having four magnetic field sensing elements for sensing a motion of a target object, a plurality of magnetic field sensing elements for sensing a stray magnetic field, and an electronic circuit.

Referring now to FIG. 3, a magnetic field sensor can include a substrate 300, for example, a semiconductor substrate. In some embodiments, i.e., back-biased arrangements, the magnetic field sensor can also include a permanent magnet 314 disposed proximate to the substrate 300.

Four magnetic field sensing elements 302, 304, 306, 308 can be disposed upon the substrate 300. The four magnetic field sensing elements 302, 304, 306, 308 are also designated C1, S1, C2, S2, respectively. The magnetic field sensing elements 302, 304, 306, 308 can be disposed along a straight line. The four magnetic field sensing elements 302, 304, 306, 308 can be included in the magnetic field sensing elements 104, 204 of FIGS. 1 and 2, disposed along lines 110, 208. It will be understood from discussion below, that the magnetic field sensing elements 302, 304, 306, 308 can be responsive to a target object 316 having features with a width represented by a line 318. For back-biased arrangements, the target object 316 can be a ferromagnetic gear having gear teeth and gear valleys, i.e., features 316a, 316b. For non back-biased arrangements, the target object 316 can be a ring magnet having alternating north and south pole regions, i.e., 316a, 316b.

The four magnetic field sensing elements 302, 303, 306, 308 are drawn using symbols to indicate TMR elements. Within the symbols are arrows, which are indicative of magnetic directions of reference layers within the TMR elements. The magnetic directions of the reference layers indicated by arrows are parallel to maximum response axes of the four magnetic field sensing elements 302, 304, 306, 308. Maximum response axes of the four magnetic field sensing elements 302, 304, 306, 308 are parallel to each other and can be parallel to the major surface of the substrate 300. Maximum response axes of the four magnetic field sensing elements 302, 304, 306, 308 can be parallel to the direction of motion of the target object 316 indicated by a line 320.

In other embodiments, the four magnetic field sensing elements 302, 304, 306, 308 can be replaced by other types of magnetic field sensing element, for example, GMR elements, AMR elements, or vertical Hall effect elements, which also have maximum response axes parallel to the major surface of the substrate 300.

The four magnetic field sensing elements 302, 303, 306, 308 are responsive to a magnetic field indicative of a motion of the target object 316. However, the four magnetic field sensing elements 302, 303, 306, 308 are also undesirably responsive to external stray magnetic fields that can arise from any external magnetic source.

A line 324 is indicative of a full spatial period of the target object 316, e.g., from a rising edge to a next rising edge of a gear tooth of a gear, or from an edge of a north pole to an edge of a next north pole of a ring magnet.

The target object 316 can be operable to rotate around a rotation axis 322 such that the features of the target object move substantially parallel to the line 320.

As in FIGS. 1 and 2, the target object 320 in the top view shown can actually be over the magnetic field sensing elements 302, 304, 306, 308, but is here shown to be not over the substrate 300 merely for clarity. The same can be true for similar figures described below.

A plurality of magnetic field sensing elements 310a-310N can also be disposed on the substrate 300, and can also be included in the magnetic field sensing elements 104, 204 of FIGS. 1 and 2. The plurality of magnetic field sensing elements 310a-310N can be operable to detect and measure a stray (unwanted, external, or common mode) magnetic field from an external magnetic field source, but as will be understood from discussion below, the plurality of magnetic field sensing elements 310a-310N is not responsive to the motion of the target object. Thus, the response of the four magnetic field sensing elements 302, 303, 306, 308 to the stray magnetic fields can removed by using the response of the plurality of magnetic field sensing elements 310a-310N to the stray magnetic fields.

As described above in conjunction with the four magnetic field sensing elements 302, 304, 306, 308, the plurality of magnetic field sensing elements 301a-310N is drawn showing TMR elements with reference layer magnetic directions parallel to and aligned with the reference layer magnetic directions of the four magnetic field sensing elements 302, 304, 306, 308. Thus, the plurality of magnetic field sensing elements 310a-310N each have a respective maximum response axis parallel to each other and parallel to maximum response axes of the four magnetic field sensing elements 302, 304, 306, 308.

Like the four magnetic field sensing elements 302, 304, 306, 308, the plurality of magnetic field sensing elements 310a-310N can be replaced by other types of magnetic field sensing elements, for example, GMR elements, AMR elements, or vertical Hall effect elements.

An electronic circuit 312 can also be disposed upon the substrate 302. The electronic circuit 312 can be electrically coupled to the four magnetic field sensing elements 302, 304, 306, 308 and to the plurality of magnetic field sensing elements 310a-310N. The electronic circuit 312 is further described in conjunction with FIGS. 4-6 below. The electronic circuit 312 can be operable to sense the movement of the target object 316 using the four magnetic field sensing elements 302, 304, 306, 308, which can also sense a stray (unwanted) magnetic field. The plurality of magnetic field sensing elements 310a-310N can be operable to sense only the stray magnetic field, and thus, the electronic circuit 312 can subtract the effect of the stray magnetic field from that which is sensed by the four magnetic field sensing elements 302, 304, 306, 308.

A separation between magnetic field sensing elements 302, 306 and a separation between the magnetic field sensing elements 304, 308 are each about one half of the spatial period represented by the line 324 as represented by lines 326, 327. However, the separation between above element pairs can be between about one hundred seventy degrees and about one hundred ninety degrees of the three hundred sixty degree spatial period.

In some embodiments, the separations are the same, and in other embodiments, the spacings are different. A total span between centers of outer ones of the four magnetic field sensing elements 302, 304, 306, 308 can be about seventy five percent of the spatial period represented by the line 324.

In order to achieve output signals from the magnetic field sensing elements 302, 306 combined in a first bridge that are one hundred and eighty degrees apart from signals generated by the magnetic field sensing elements 304, 308 combined in a second bridge as the target object moves (see arctan processor 606 of FIG. 6), in some embodiments, the separation represented by the lines 326, 327 may be close to but different than one half of the full spatial period of the target object 316 represented by the line 324. This difference may be due to an air gap indicated by a line 315 and by a radius of curvature of the target object about the rotation axis 322.

A total spacing of the plurality of magnetic field sensing elements 310a-310N, represented by a line 328, can be one magnetic field sensing element less than the full spatial cycle represented by the line 324. Specifically, if the plurality of magnetic field sensing elements 310a-301N contains x magnetic field sensing elements and the full spatial period represented by the line 324 is y, then a spacing between adjacent ones of the plurality of magnetic field sensing elements 310a-310N is y/x. A span of the plurality magnetic field sensing elements 310a-310N represented by a line 324 is y (1−1/x), which is one magnetic field sensing element spacing less than the full spatial cycle represented by the line 324.

The above span represented by the line 328 results in an equal number of the plurality of magnetic field sensing elements 310a-310N that experience the feature 316a as those that experience the feature 316b, e.g., an equal number that experience a north pole as experience a south pole, regardless of the rotational position the target object 316 relative to the substrate (which can be considered to be an absolute rotational position of the target object). Thus, the plurality of magnetic field sensing elements 310a-310N in not responsive (or is minimally responsive, e.g., under one percent responsive) to changes of magnetic field resulting from movement of the target object 316. However, the plurality of magnetic field sensing elements 310a-310N is fully responsive to a stray (external) magnetic field, and is responsive to the stray magnetic field in a way that is the same as or similar to the response of the four magnetic field sensing elements 302, 304, 306, 308 to the stray magnetic field.

Figure 4:
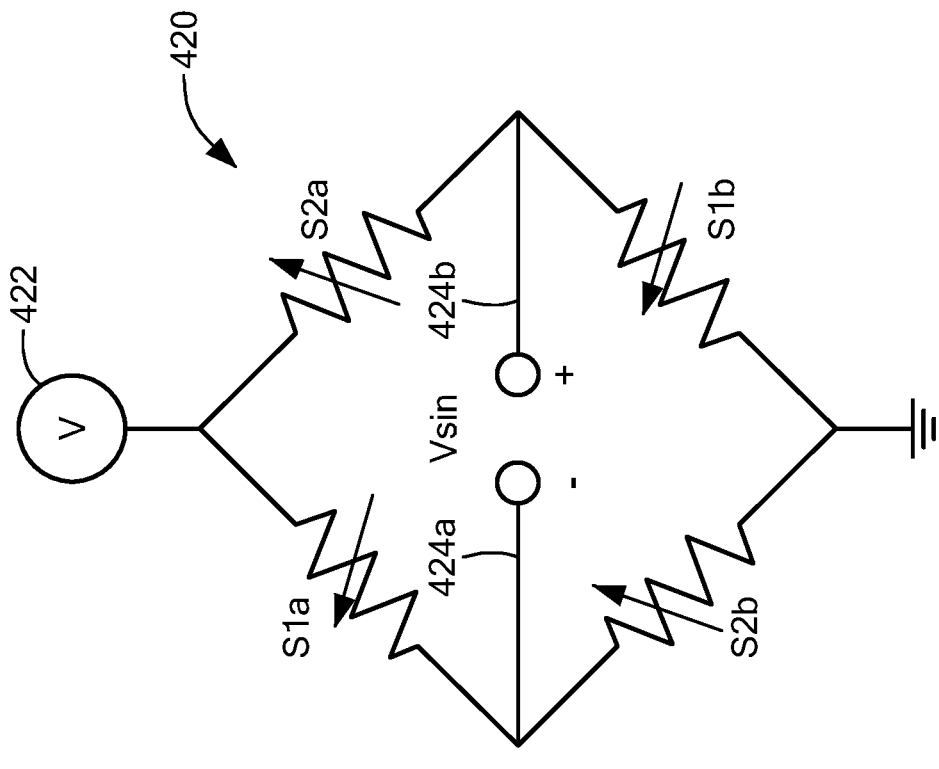
FIG. 4 is a schematic diagram of the four magnetic field sensing elements of FIG. 3 arranged in two full bridge circuits to generate sine and cosine signals.
Figure 4:
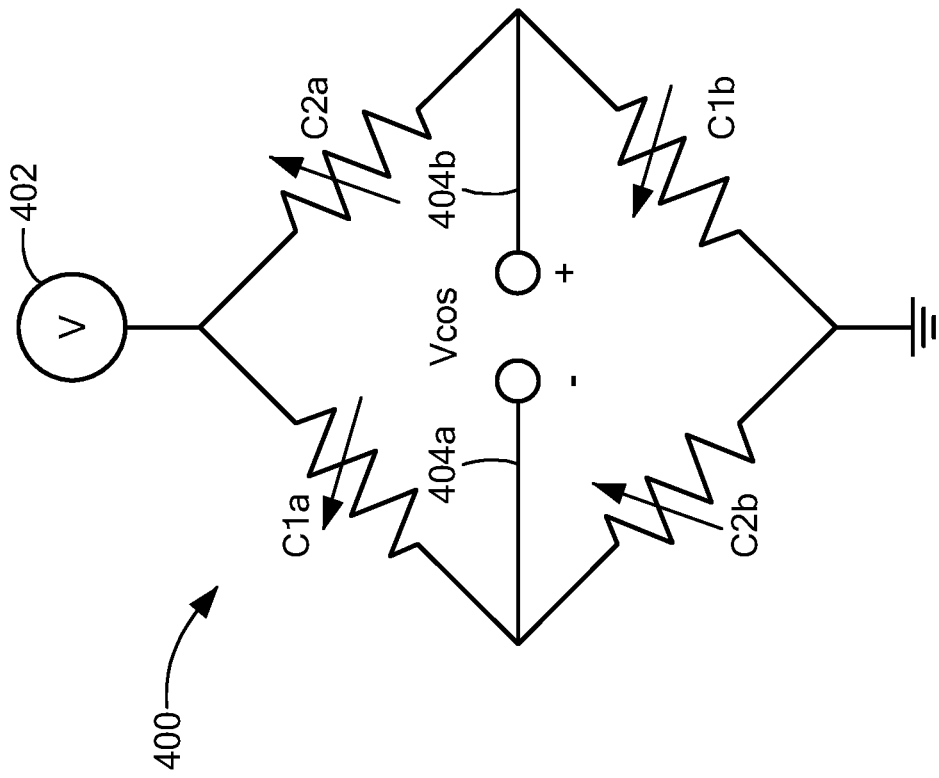

Referring now to FIG. 4, and using the designations C1, C2, S1, S2 also shown in FIG. 3, the four magnetic field sensing elements C1, C2, S1, S2 can be coupled into first and second bridge arrangements 400, 420, respectively, to generate a differential cosine signal 404a, 404b and a differential sine signal 424a, 424b. The first and second bridge arrangements 400, 420 can be coupled to voltage generators 402, 422, respectively. As the target object 316 of FIG. 3 moves, in some embodiments, the differential cosine signal 404a, 404b and the differential sine signal 424a, 424b are about ninety degrees apart in phase due to physical separations of the four magnetic field sensing elements C1, C2, S1, S2, as described above in conjunction with FIG. 3.

Figure 5:
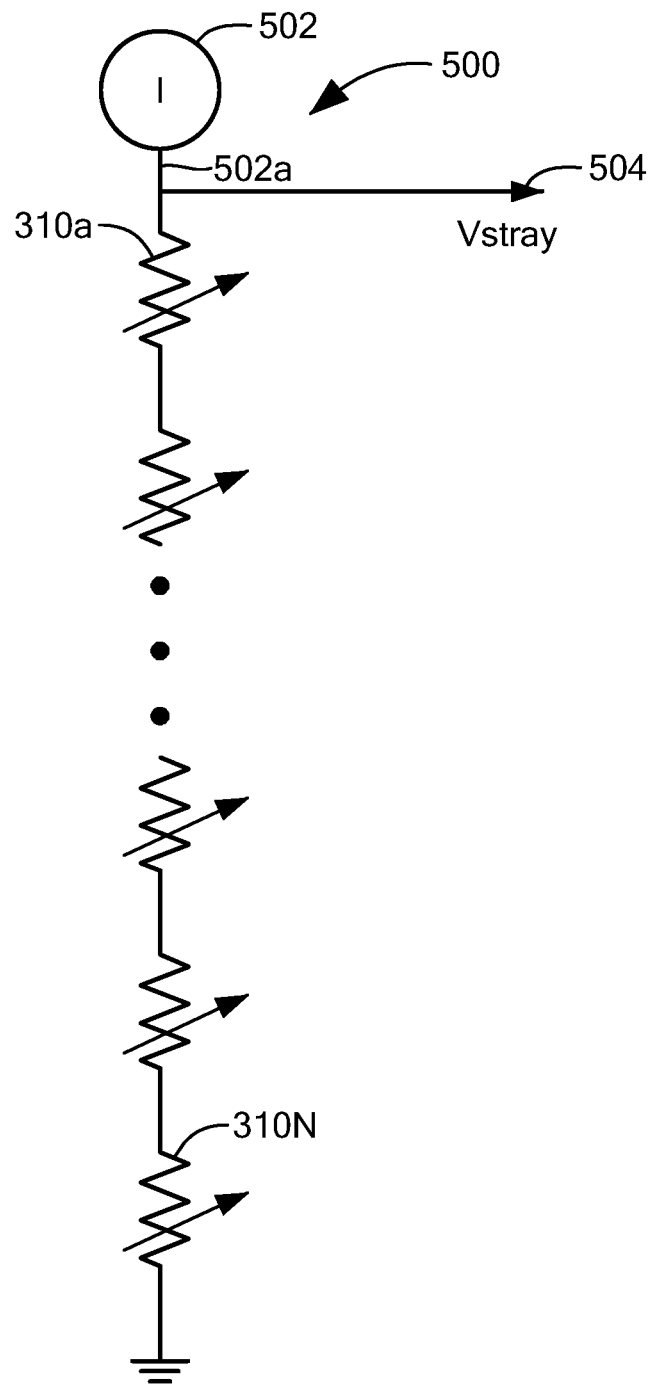
FIG. 5 is a schematic diagram showing the plurality of magnetic field sensing elements of FIG. 3 arranged in a series coupled arrangement.

Referring now to FIG. 5, in which like elements of FIG. 3 are shown having like reference designations, the plurality of magnetic field sensing elements 310a-310N can be coupled in series with a current generator 502 to generate a stray field signal 504 responsive only to a stray magnetic field and substantially not responsive to movement of the target object 316 of FIG. 3.

Figure 6:
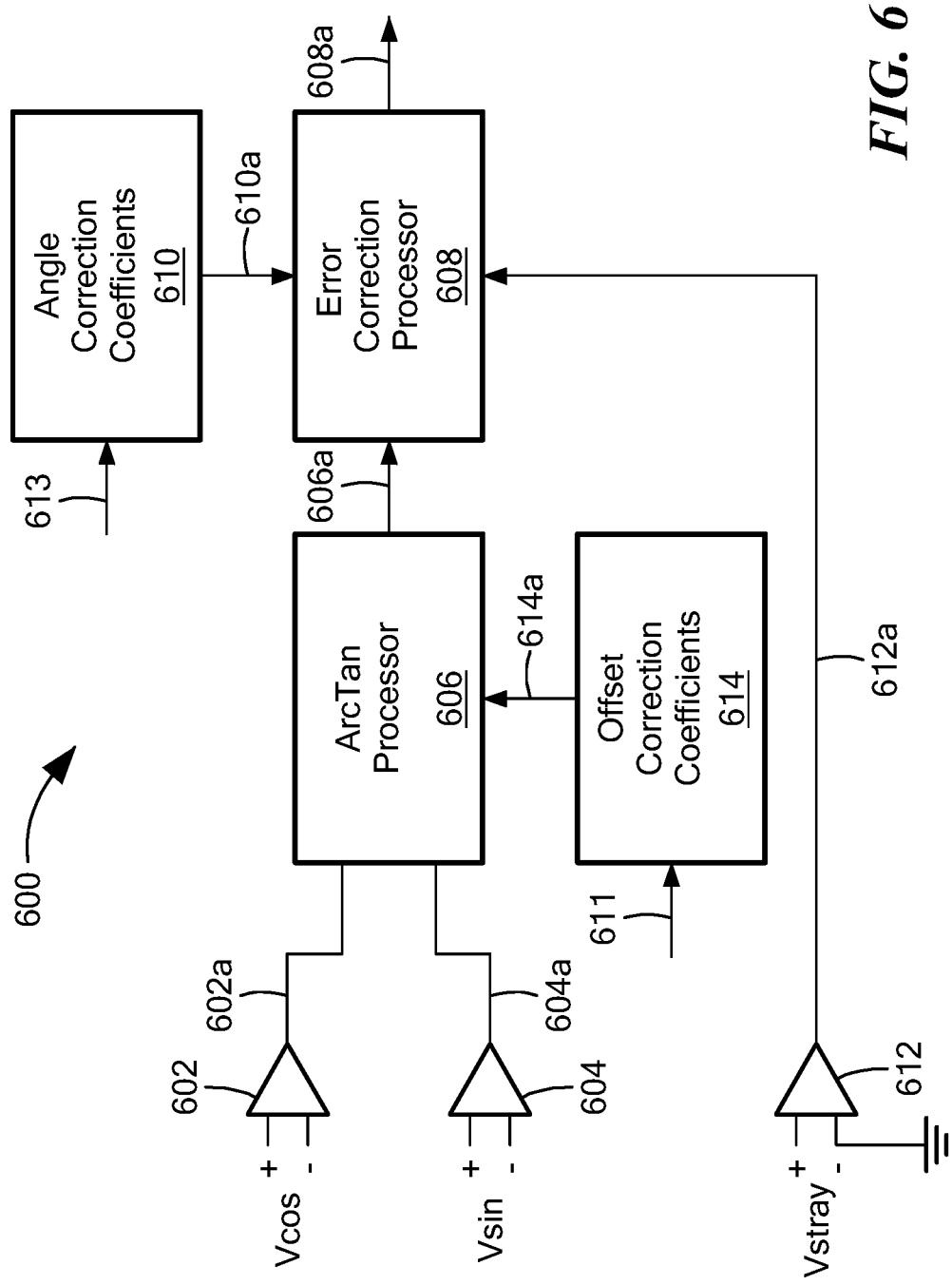
FIG. 6 is a block diagram of an illustrative electronic circuit that can serve as the electronic circuit of FIGS. 1-3.

Referring now to FIG. 6, an electronic circuit 600 can be the same as or similar to electronic circuits 104, 204, 312 of FIGS. 1, 2, and 3.

Amplifiers 602, 604 can be coupled to the cosine signal 404a, 404b and to the sine signal 424a, 424b of FIG. 4. The amplifier 602 can generate an amplified signal 602a and the amplifier 604 can generate an amplified signal 604a.

An arctangent processor 606 (e.g., a CORDIC processor) can be coupled to the amplified signals 602a, 604a and can generate an uncorrected angle signal 606a indicative of an uncorrected angle of a magnetic field sensed by the four magnetic field sensing elements 304, 306, 308, 310 of FIG. 3. The sensed angle can be indicative of an angle within a full spatial period of the target object 316 represented by the line 324. Thus, the uncorrected angle signal 606a is indicative of the features 316a, 316b of the target object 316 passing by the substrate 300 of FIG. 3. The uncorrected angle signal 606a can have angle errors.

Stored offset correction coefficients 614 stored within a nonvolatile memory (e.g., an EEPROM) can be provided as offset correction values 614a to the arctangent processor 606. The offset correction values 614a can correct for offset (DC errors) of the outputs of the four magnetic field sensing elements 302, 304, 306, 308 and/or of the cosine signal 404a, 404b and sine signal 424a, 424b of FIGS. 3 and 4.

The stored offset correction coefficients 614 can be provided to the offset correction coefficients 614 as a signal 611 from outside of the electronic circuit 600, for example, by test and calibration equipment, during manufacture of the magnetic field sensor that uses the electronic circuit 600.

The electronic circuit 600 can also include angle correction coefficients 610, which may be stored in a nonvolatile memory (e.g., an EEPROM), and which may be provided as angle correction values 610a to an error correction processor 608. The error correction processor 608 can also receive the uncorrected angle signal 606a. With the angle correction values 610a, the error correction processor 608 can correct for angle errors within the angle signal 606a when not in the presence of a stray magnetic field, which would otherwise occur in the presence of a stray magnetic field.

The stored angle correction coefficients 610 can be provided to the angle correction coefficients 610 as a signal 613 from outside of the electronic circuit 600, for example, by test and calibration equipment, during manufacture of the magnetic field sensor that uses the electronic circuit 600.

The electronic circuit 600 can also include an amplifier 612 to receive a stray field signal, e.g., the stray field signal 504 of FIG. 5. The amplifier 612 can generate an amplified stray field signal 612a coupled to the error correction processor 608. The error correction processor 608 can be operable to remove the influence of stray magnetic fields within the uncorrected angle signal 606a, the stray magnetic fields indicated by the amplified stray field signal 612a.

As a result of the above corrections, the error correction processor 608 is operable to generate a corrected angle signal 608a that has angle errors much reduced from those of the uncorrected angle signal 606a.

Figure 7:
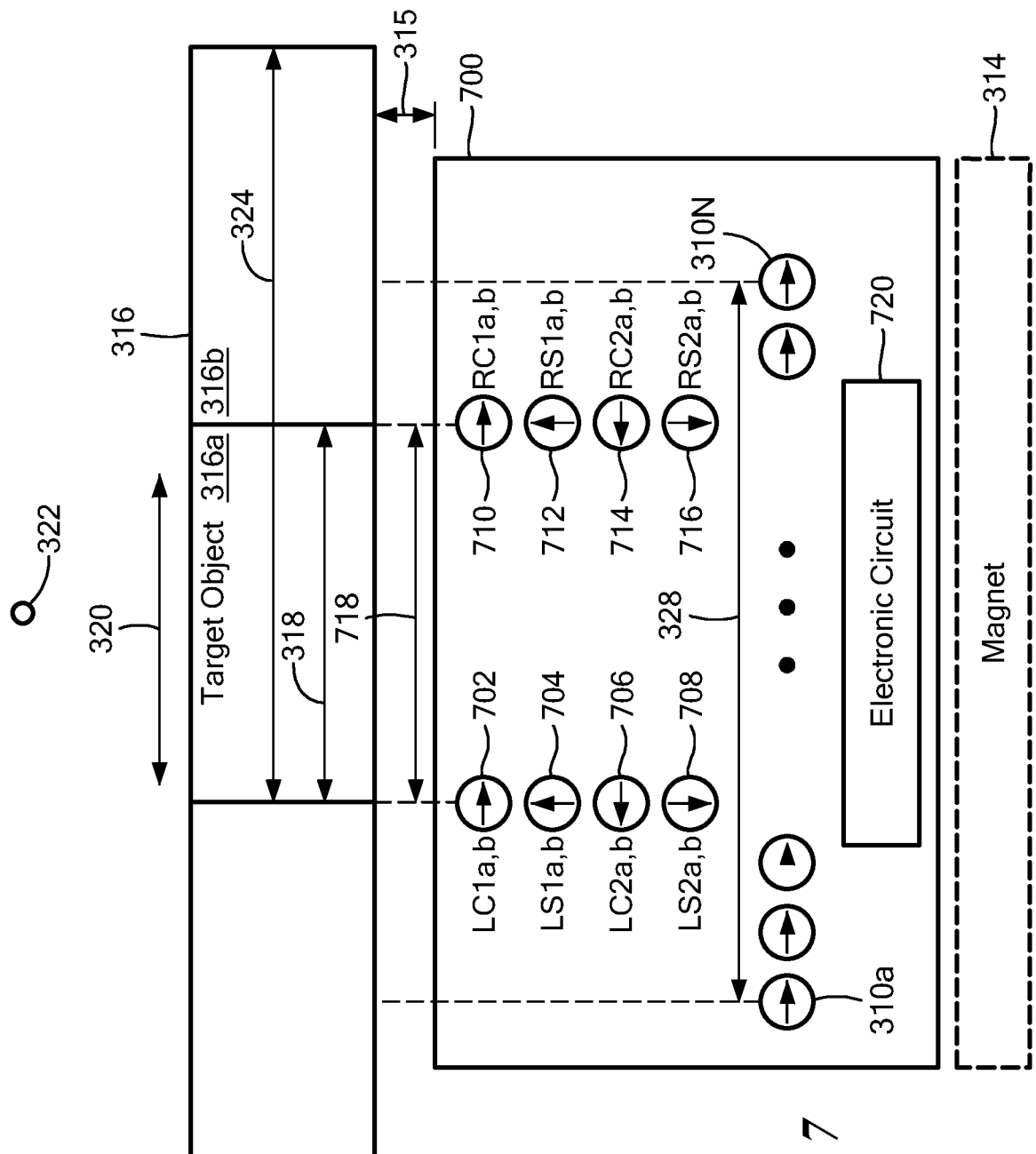
FIG. 7 is a top view of a magnetic field sensor having eight magnetic field sensing elements for sensing a motion of a target object, a plurality of magnetic field sensing elements for sensing a stray magnetic field, and an electronic circuit.

Referring now to FIG. 7, in which like elements of FIG. 3 are shown having like reference designations, a magnetic field sensor can include a substrate 700, for example, a semiconductor substrate. In some embodiments, i.e., back-biased arrangements, the magnetic field sensor can also include the permanent magnet 314 disposed proximate to the substrate 700.

A first four pairs of magnetic field sensing elements 702, 704, 706, 708 can be disposed upon the substrate 700. The first four pairs of magnetic field sensing elements 702, 704, 706, 708 are also designated LC1a,b and LS1a,b and LC2a,b and LS2a,b, respectively, where the designation a,b refers to two magnetic field sensing elements. The first four pairs of magnetic field sensing elements 702, 704, 706, 708 can be disposed along a straight line perpendicular to the direction of motion indicated by the line 320.

A second four pairs of magnetic field sensing elements 710, 712, 714, 716 can also be disposed upon the substrate 700. The second four pairs of magnetic field sensing elements 710, 712, 714, 716 are also designated RC1a,b and RS1a,b and RC2a,b and RS2a,b, respectively. The second four pairs of magnetic field sensing elements 710, 712, 714, 716 can be disposed along a straight line perpendicular to the direction of motion indicated by the line 320, and separated from the first four pairs of magnetic field sensing element 702, 704, 706, 708 by a distance indicated by a line 718, which separation can be about one half of a full physical cycle (having a spatial period) of the target object 316 represented by the line 324. However, the separation can be between about 0.4 and about 0.6 of a spatial period of the target object 316.

In order to achieve output signals from the first four pairs of magnetic field sensing elements 702, 704, 706, 708 that are one hundred and eighty degrees apart from signals generated by the second four pairs of magnetic field sensing elements 710, 712, 714, 716 as the target object moves (see arctan processor 1106 of FIG. 11), in some embodiments, the separation represented by the line 718 may be close to but different than one half of the spatial period of the target object 316 represented by the line 324. In other words, a length of the line 718 may be a bit different than on half of the line 324. This difference may be due to an air gap indicated by a line 315 and by a radius of curvature of the target object about the rotation axis 322.

It will be understood from discussion below, that the first four pairs of magnetic field sensing elements 702, 704, 706, 708 and the second four pairs of magnetic field sensing elements 710, 712, 714, 716 can be responsive to the target object 316 having features with a width represented by the line 318. However, the first four pairs of magnetic field sensing elements 702, 704, 706, 708 and the second four pairs of magnetic field sensing elements 710, 712, 714, 716 are also responsive to an undesirable external stray magnetic field.

The first four pairs of magnetic field sensing elements 702, 704, 706, 708 and the second four pairs of magnetic field sensing elements 710, 712, 714, 716 are drawn using symbols to indicate TMR elements. Within the symbols are arrows, which are indicative of magnetic directions of reference layers within the TMR elements. The magnetic directions of the reference layers indicated by arrows are in four different directions, which are parallel to respective maximum response axes of the first and second four pairs of magnetic field sensing elements 702, 704, 706, 708, 710, 712, 714, 716. Maximum response axes of the first four pairs of magnetic field sensing elements 702, 704, 706, 708 are each in a different direction, each of which can be parallel to the major surface of the substrate 700. Maximum response axes of the second four pairs of magnetic field sensing elements 710, 712, 714, 716 are also each in a different direction, each of which can be parallel to the major surface of the substrate 700. The four different directions are parallel to Cartesian coordinate axes. Maximum response axes of two of the first four pairs of magnetic field sensing elements 702, 706 and two of the second four pairs of magnetic field sensing element 710, 714 can also be parallel to the direction of motion of the target object 316 indicated by the line 320.

The first four pairs of magnetic field sensing elements 702, 704, 706, 708 and the second four pairs of magnetic field sensing elements 710, 712, 714, 716 can be included in the magnetic field sensing elements 104, 204 of FIGS. 1 and 2.

In other embodiments, the first and second four pairs of magnetic field sensing elements 702, 704, 706, 708, 710, 712, 714, 716 can be replaced by other types of magnetic field sensing element, for example, GMR elements, AMR elements, or vertical Hall effect elements, which also have maximum response axes parallel to the major surface of the substrate 700.

The plurality of magnetic field sensing elements 310a-310N described above in conjunction with FIG. 3 can also be disposed on the substrate 700. The plurality of magnetic field sensing elements 310a-310N can be operable to detect and measure a stray (unwanted) magnetic field from an external magnetic field source. For reasons described above in conjunction with FIG. 3, the plurality of magnetic field sensing elements 310a-310N are not responsive (or minimally responsive) to the movement of the target object 316 in a direction indicated by the line 320.

An electronic circuit 720 can also be disposed upon the substrate 702. The electronic circuit 720 can be electrically coupled to the first and second four pairs of magnetic field sensing elements 702, 704, 706, 708, 710, 712, 714, 716 and to the plurality of magnetic field sensing elements 310a-310N. The electronic circuit 720 is further described in conjunction with FIGS. 8-11 below. The electronic circuit 720 can be operable to sense the movement of the target object 716 using the first and second four pairs of magnetic field sensing elements 702, 704, 706, 708, 710, 712, 714, 716, which can also sense a stray (unwanted) magnetic field. The plurality of magnetic field sensing elements 310a-310N can be operable to sense only the stray magnetic field, and thus, the electronic circuit 720 can subtract the effect of the stray magnetic field from that which is sensed by the first and second four pairs of magnetic field sensing elements 702, 704, 706, 708, 710, 712, 714, 716.

Figure 8:
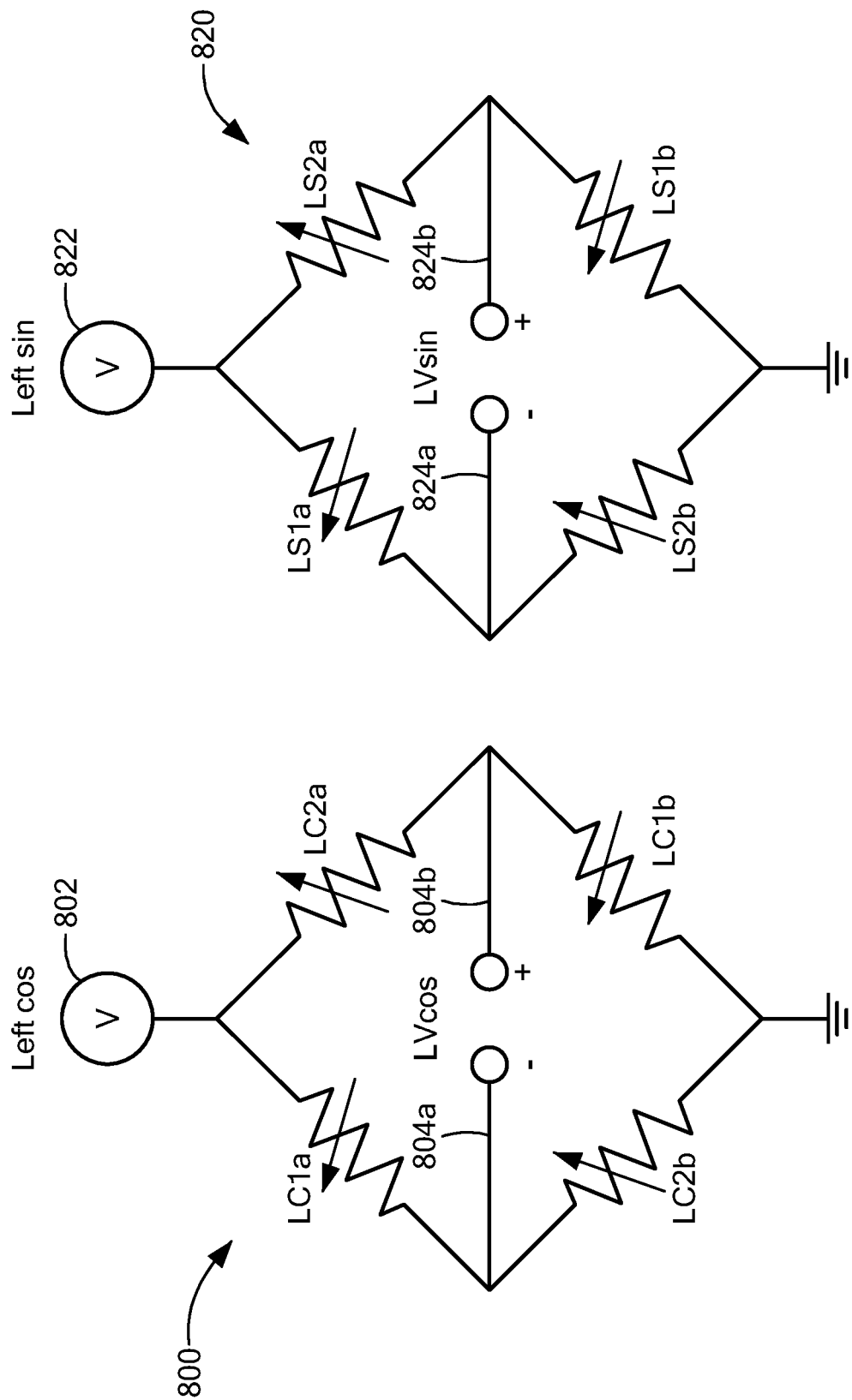
FIG. 8 is a schematic diagram of the four of the eight magnetic field sensing elements of FIG. 7 arranged in two full bridge circuits to generate a first sine signal and a first cosine signal.

Referring now to FIG. 8, and using the designations LC1a,b and LS1a,b and LC2a,b and LS2a,b also shown in FIG. 7, the first four pairs of magnetic field sensing elements LC1a,b and LS1a,b and LC2a,b and LS2a,b can be coupled into first and second bridge arrangements 800, 820, respectively, to generate a differential left cosine signal 804a, 804b and a differential left sine signal 824a, 824b. The first and second bridge arrangements 800, 820 can be coupled to voltage generators 802, 822, respectively. As the target object 316 of FIG. 7 moves, the differential left cosine signal 804a, 804b and the differential left sine signal 824a, 824b can be about ninety degrees apart in phase.

Figure 9:
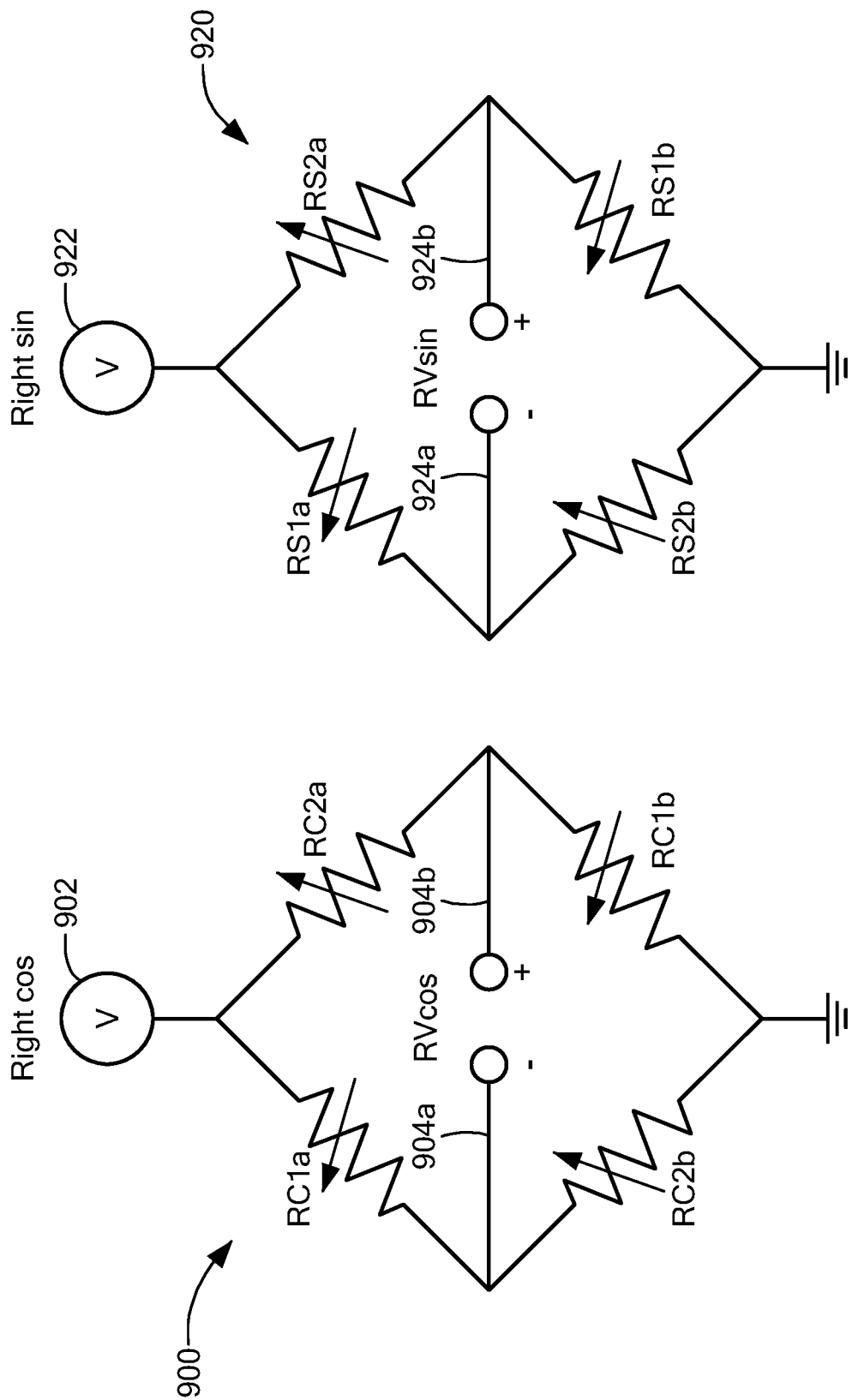
FIG. 9 is a schematic diagram of the another four of the eight magnetic field sensing elements of FIG. 7 arranged in another two full bridge circuit to generate a second sine signal and a second cosine signal.

Referring now to FIG. 9, and using the designations RC1a,b and RS1a,b and RC2a,b and RS2a,b also shown in FIG. 7, the second four pairs of magnetic field sensing elements RC1a,b and RS1a,b and RC2a,b and RS2a,b can be coupled into first and second bridge arrangements 900, 920, respectively, to generate a differential right cosine signal 904a, 904b and a differential right sine signal 924a, 924b. The first and second bridge arrangements 900, 920 can be coupled to voltage generators 902, 922, respectively. As the target object 316 of FIG. 7 moves, the differential right cosine signal 904a, 904b and the differential right sine signal 924a, 924b can be about ninety degrees apart in phase.

Figure 10:
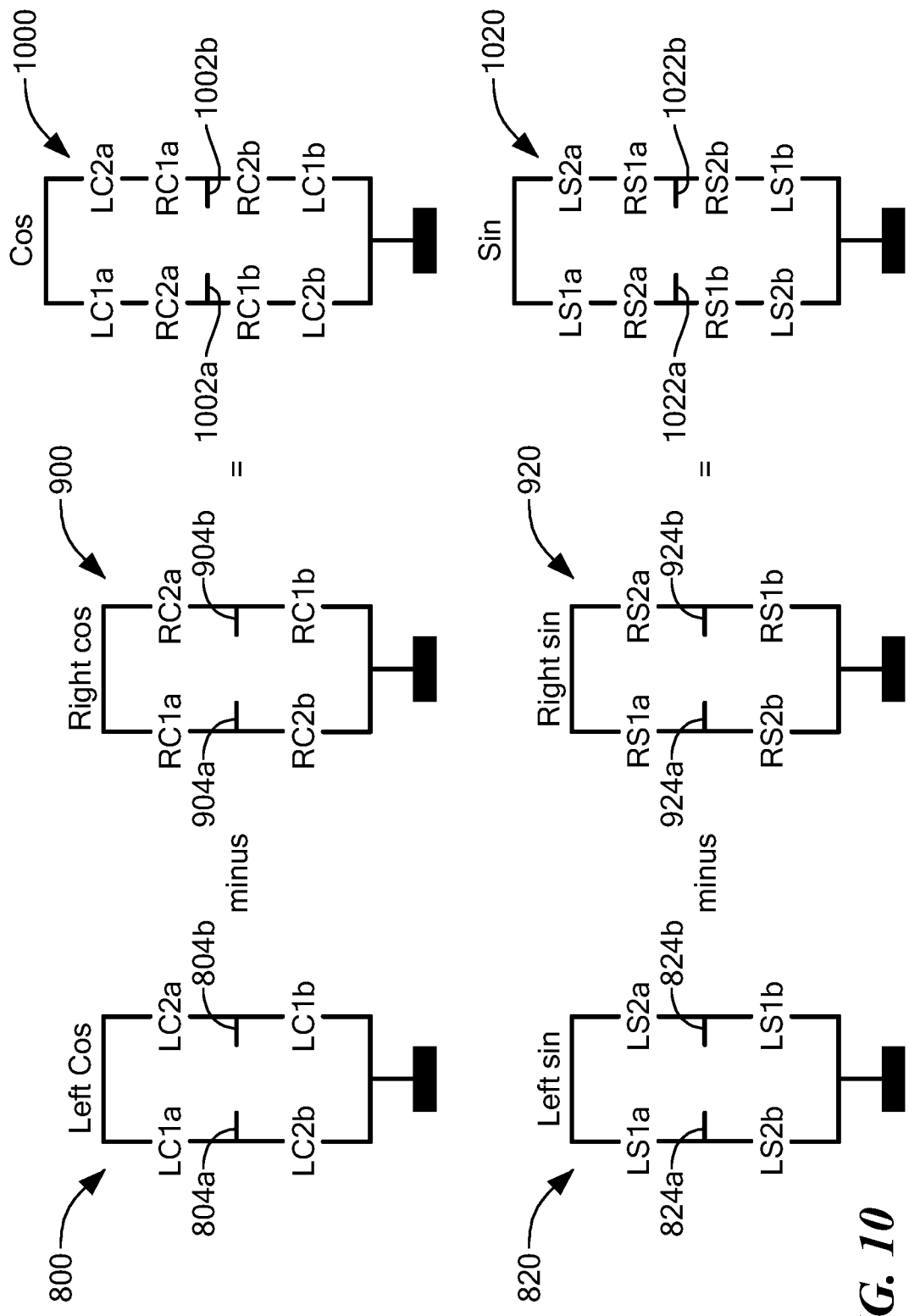
FIG. 10 is a schematic diagram of showing couplings of the first signal, the first cosine signal, the second sine signal, and the second cosine signal to produce a combined sine signal and a combined cosine signal.

Referring now to FIG. 10, in which like elements of FIGS. 8 and 9 have like reference designations, signals generated by the bridge arrangements 800 and 900 can be combined to result in a combined bridge arrangement 1000 to generate a differential combined cosine signal 1002a, 1002b. Similarly, signals generated by the bridge arrangements 820 and 920 can be combined to result in a combined bridge arrangement 1020 to generate a differential combined sine signal 1022a, 1022b.

Bridges 800 and 900 (and also bridges 820 and 920) generate signals that are at one hundred eighty degrees relative to each other in response to the target 316, but signals that are in phase in response to the stray (or external) magnetic field. Thus, the combined bridge arrangement 1000 and the combined bridge arrangement 1020 can generate differential bridge signals 1002a, 1002b and 1022a, 1022b, respectively, for which a signal in response to the target 316 is retained, but a signal in response to the stray (or external) magnetic field is canceled. In view of the above, the combined bridge arrangements 1000 and 1020 can reduce an impact of the stray (or external) magnetic field upon the magnetic field sensing elements 702-716 of FIG. 7, without need of the plurality of magnetic field sensing elements 310a-310N. However, the bridge arrangements 1000 and 1002 can still be used in combination with the plurality of magnetic field sensing elements 310a-310N to further improve rejection of influence from stray (or external) magnetic fields.

Figure 11:
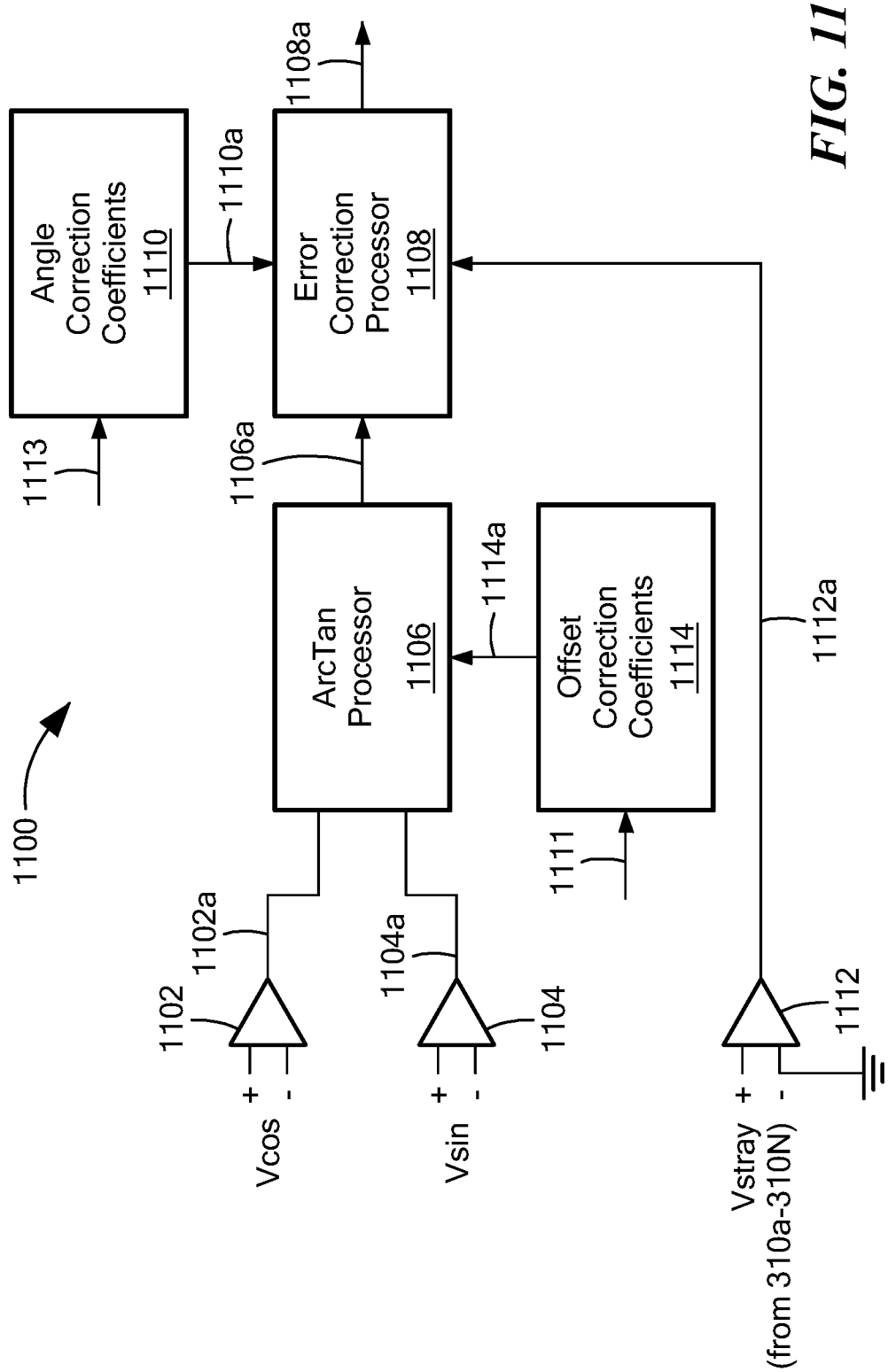
FIG. 11 is a block diagram of an illustrative electronic circuit that can serve as the electronic circuit of FIG. 7.

Referring now to FIG. 11, an electronic circuit 1100, similar to the electronic circuit 600 of FIG. 6, can be the same as or similar to electronic circuits 104, 204, 720 of FIGS. 1, 2, and 7.

Amplifiers 1102, 1104 can be coupled to the differential combined cosine signal 1002a, 1002b and to the differential combined sine signal 1022a, 1022b, respectively, of FIG. 10. The amplifier 1102 can generate an amplified signal 1102a and the amplifier 1104 can generate an amplified signal 1104a.

An arctangent processor 1106 (e.g., a CORDIC processor) can be coupled to the first and second amplified signals 1102a, 1104a and can generate an uncorrected angle signal 1106a indicative of an uncorrected angle of a magnetic field sensed by the first four pairs of magnetic field sensing elements 702, 704, 706, 708 and by the second four pairs of magnetic field sensing elements 710, 712, 714, 716 of FIG. 7. The sensed angle can be indicative of an angle within a full spatial period of the target object 316 represented by the line 324 of FIG. 7. Thus, the uncorrected angle signal 1106a is indicative of the features 316a, 316b of the target object 316 passing by the substrate 700 of FIG. 7. The uncorrected angle signal 1106a can have angle errors.

Stored offset correction coefficients 1114 stored within a nonvolatile memory (e.g., and EEPROM) can be provided as offset correction values 1114a to the arctangent processor 1106. The offset correction values 1114a can correct for offset (DC errors) of the outputs of the first four pairs of magnetic field sensing elements 702, 704, 706, 708 and by the second four pairs of magnetic field sensing elements 710, 712, 714, 716 of FIG. 7 and/or of the differential combined cosine signal 1002a, 1002b and differential combined sine signal 1022a, 1022b of FIG. 10.

The stored offset correction coefficients 1114 can be provided to the offset correction coefficients 1114 as a signal 1111 from outside of the electronic circuit 1100, for example, by test and calibration equipment, during manufacture of the magnetic field sensor that uses the electronic circuit 1100.

The electronic circuit 1100 can also include angle correction coefficients 1110, which may be stored in a nonvolatile memory (e.g., and EEPROM), and which may be provided as angle correction values 1110a to an error correction processor 1108. The error correction processor 1108 can also receive the uncorrected angle signal 1106a. With the angle correction values 110a, the error correction processor 1108 can correct for angle errors within the angle signal 1106a when not in the presence of a stray magnetic field, which would otherwise occur in the presence of a stray magnetic field.

The stored angle correction coefficients 1110 can be provided to the angle correction coefficients 1110 as a signal 1113 from outside of the electronic circuit 1100, for example, by test and calibration equipment, during manufacture of the magnetic field sensor that uses the electronic circuit 1100.

The electronic circuit 1100 can also include an amplifier 1112 to receive a stray field signal, e.g., the stray field signal 504 of FIG. 5. The amplifier 1112 can generate an amplified stray field signal 1112a coupled to the error correction processor 1108. The error correction processor 1108 can be operable to remove the influence of stray magnetic fields within the uncorrected angle signal 1106a, the stray magnetic fields indicated by the amplified stray field signal 1112a.

As a result of the above corrections, the error correction processor 1108 is operable to generate a corrected angle signal 108a that has angle errors much reduced from those of the uncorrected angle signal 1106a.

Figure 12:
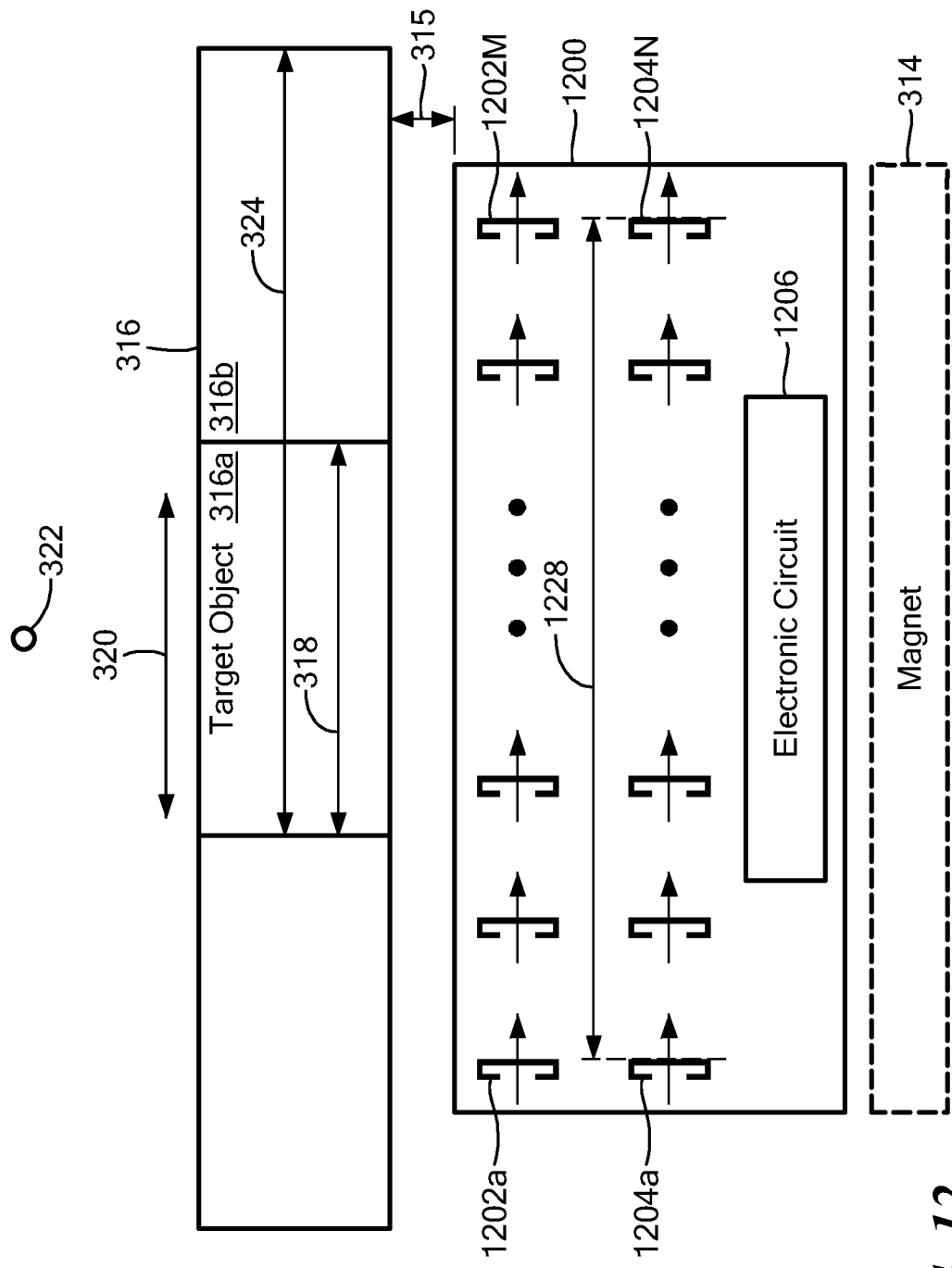
FIG. 12 is a top view of a magnetic field sensor having a first plurality of magnetic field sensing elements for sensing a motion of a target object, a second plurality of magnetic field sensing elements for sensing a stray magnetic field, and an electronic circuit.

Referring now to FIG. 12, in which like elements of FIG. 3 are shown having like reference designations, a magnetic field sensor can include a substrate 1200, for example, a semiconductor substrate. In some embodiments, i.e., back-biased arrangements, the magnetic field sensor can also include the permanent magnet 314 disposed proximate to the substrate 1200.

A first plurality of magnetic field sensing elements 1202a-1202M can be disposed upon the substrate 1200. The first plurality of magnetic field sensing elements 1202a-1202M can include three or more magnetic field sensing elements. The first plurality of magnetic field sensing elements 1202a-1202M can be disposed along a straight line. The first plurality of magnetic field sensing elements 1202a-1202M can be included in the magnetic field sensing elements 104, 204 of FIGS. 1 and 2, disposed along lines 110, 208. It will be understood from discussion below, that the first plurality of magnetic field sensing elements 1202a-1202M can be responsive to the target object 316 having features with a width represented by the line 318. For back-biased arrangements, the target object 316 can be a ferromagnetic gear having gear teeth and gear valleys, i.e., features 316a, 316b. For non-back-biased arrangements, the target object 316 can be a ring magnet having alternating north and south pole regions, i.e., 316a, 316b.

The first plurality of magnetic field sensing elements 1202a is drawn using symbols to indicate GMR elements. Within the symbols are arrows, which are indicative of magnetic directions of reference layers within the GMR elements. The magnetic directions of the reference layers indicated by arrows are parallel to maximum response axes of the first plurality of magnetic field sensing elements 1202a-1202M. Maximum response axes of the first plurality of magnetic field sensing elements 1202a-1202M can be parallel to each other and can be parallel to the major surface of the substrate 1200. Maximum response axes of the first plurality of magnetic field sensing elements 1202a-1202M can be parallel to the direction of motion of the target object 316 indicated by a line 320.

In other embodiments, the first plurality of magnetic field sensing elements 1202a-1202M can be replaced by other types of magnetic field sensing element, for example, TMR elements, AMR elements, or vertical Hall effect elements, which also have maximum response axes parallel to the major surface of the substrate 1200.

The first plurality of magnetic field sensing elements 1202a-1202M is responsive to a magnetic field indicative of a motion of the target object 316. To this end, the first plurality of magnetic field sensing elements 1202a-1202M is processed differently than is a second plurality of magnetic field sensing element 1204a-1204N described below. However, the first plurality of magnetic field sensing elements 1202a-1202M is also undesirably responsive to external stray magnetic fields that can arise from any external magnetic source.

The line 324 is indicative of a full spatial cycle of the target object 316, e.g., from a rising edge to a next rising edge of a gear tooth of a gear, or from an edge of a north pole to an edge of a next north pole of a ring magnet.

The target object 316 can be operable to rotate around the rotation axis 322 such that the features of the target object move substantially parallel to the line 320.

As in FIGS. 1 and 2, the target object 320 in the top view shown can actually be over the first plurality of magnetic field sensing elements 1202a-1202M, but is here shown to be not over the substrate 1200 merely for clarity. The same can be true for similar figures described below.

A second plurality of magnetic field sensing elements 1204a-1204N can also be disposed on the substrate 1200, and can also be included in the magnetic field sensing elements 104, 204 of FIGS. 1 and 2. The second plurality of magnetic field sensing elements 1204a-1204N can be operable to detect and measure a stray (unwanted) magnetic field from an external magnetic field source, but as will be understood from discussion below, the second plurality of magnetic field sensing elements 1204a-1204N is not responsive to the motion of the target object. Thus, the response of the first plurality of the first plurality of magnetic field sensing elements 1202a-1202M to the stray magnetic fields can removed by using the response of the second plurality of magnetic field sensing elements 1204a-1204N to the stray magnetic fields.

As described above, the first plurality of magnetic field sensing elements 1202a-1202M can include three or more magnetic field sensing elements. The second plurality of magnetic field sensing elements 1204a-1204N can also include three or more magnetic field sensing elements. A quantity of magnetic field sensing elements in the first plurality of magnetic field sensing elements 1202a-1202M can be the same as or different than a quantity of magnetic field sensing elements in the second plurality of magnetic field sensing elements 1204a-1202M.

As described above in conjunction with the first plurality of magnetic field sensing elements, the second plurality of magnetic field sensing elements 1201a-1210N are drawn as GMR elements with reference layer magnetic directions parallel to and aligned with the reference layer magnetic directions of the first plurality of magnetic field sensing elements 1202a-1202M. Thus, the second plurality of magnetic field sensing elements 1204a-1204N can each have a respective maximum response axis parallel to each other and parallel to maximum response axes of the first plurality of magnetic field sensing elements 1202a-1202M.

Like the first plurality of magnetic field sensing elements 1202a-1202M, the second plurality of magnetic field sensing elements 1204a-1204N can be replaced by other types of magnetic field sensing elements, for example, TMR elements, AMR elements, or vertical Hall effect elements.

An electronic circuit 1206 can also be disposed upon the substrate 1202. The electronic circuit 1206 can be electrically coupled to the first plurality of magnetic field sensing elements 1202a-1202M and to the second plurality of magnetic field sensing elements 1210a-1210N. The electronic circuit 1206 is further described in conjunction with FIGS. 13-15 below. The electronic circuit 1206 can be operable to sense the movement of the target object 316 using the first plurality of magnetic field sensing elements 1202a-1202M, which can also sense a stray (unwanted) magnetic field. The second plurality of magnetic field sensing elements 1204a-1204N can be operable to sense only the stray magnetic field, and thus, the electronic circuit 1206 can subtract the effect of the stray magnetic field from that which is sensed by the first plurality of magnetic field sensing elements 1202a-1202M.

In some embodiments, adjacent pairs of the first plurality of magnetic field sensing elements 1202a-1202M can have respective separations that result in the first plurality of magnetic field sensing elements 1202a-1202M having a total span between about 0.5 and about 1.5 of the full spatial period represented by the line 324.

In some embodiments, the spacings are the same, and in other embodiments, the spacings are different.

A total span of the second plurality of magnetic field sensing elements 1210a-1210N, represented by a line 1228, is one magnetic field sensing element less than the full spatial cycle represented by the line 324, the same as that described above for the plurality of magnetic field sensing elements 310a-310N of FIG. 3. Specifically, if the second plurality of magnetic field sensing elements 1210a-1201N contains x magnetic field sensing elements and the full spatial period represented by the line 324 is y, then a spacing between adjacent ones of the second plurality of magnetic field sensing elements 1204a-1204N is y/x. A span of the plurality magnetic field sensing elements 1204a-1204N represented by a line 324 is y (1−1/x), which is one magnetic field sensing element spacing less than the full spatial cycle represented by the line 324.

The above span represented by the line 1228 results in an equal number of the second plurality of magnetic field sensing elements 1204a-1204N that experience the feature 316a as those that experience the feature 316b, e.g., an equal number that experience a north pole as experience a south pole, regardless of the rotational position of the target object 316 relative to the substrate (i.e., an absolute rotational position). Thus, the second plurality of magnetic field sensing elements 1204a-1204N is not responsive (or is minimally responsive, e.g., under one percent responsive) to changes of magnetic field resulting from movement of the target object 316. However, the second plurality of magnetic field sensing elements 1204a-1204N is fully responsive to a stray (external) magnetic field, and is responsive to the stray magnetic field in a way that is the same as or similar to the response of the first plurality of magnetic field sensing elements 1202a-1202M to the stray magnetic field.

In some embodiments, a total number and a total span of the first plurality of magnetic field sensing elements 1202a-1202M can be the same as those of the second plurality of magnetic field sensing elements 1202a-1204N. Respective responses to magnetic fields can be different due to different processing of the signals from the first plurality of magnetic field sensing elements 1202a-1202M and from the second plurality of magnetic field sensing elements 1202a-1204N. Essentially, the second plurality of magnetic field sensing elements 1202a-1204N can be coupled in series as shown in FIG. 5, but elements of the first plurality of magnetic field sensing elements 1202a-1202M can be processed individually as describe more fully below in conjunction with FIG. 13.

In other embodiments, a total number and a total span of the first plurality of magnetic field sensing elements 1202a-1202M can be different than those of the second plurality of magnetic field sensing elements 1202a-1204N.

The first plurality of magnetic field sensing elements 1202a-1202M can be somewhat insensitive to an influence of the stray (or external) magnetic fields when used in conjunction with magnetic field sensor of 1300 described below in conjunction with FIG. 13 (i.e., the elements 1202a-1202M can be arranged to provide an output that is insensitive to stray fields). In other words, stray fields can affect the curves of FIG. 14 by offsetting and amplifying them. However, since only the phase of these curves is detected, the output can be insensitive to stray fields. Thus, the second plurality of magnetic field sensing elements 1204a-1204N may not be needed in some embodiments of the magnetic field sensor 1200. However, the first plurality of magnetic field sensing elements 1202a-1202M can still be used in the combination with the second plurality of magnetic field sensing elements 1204a, 1204N to further improve rejection of influence from stray (or external) magnetic fields.

Figure 13:
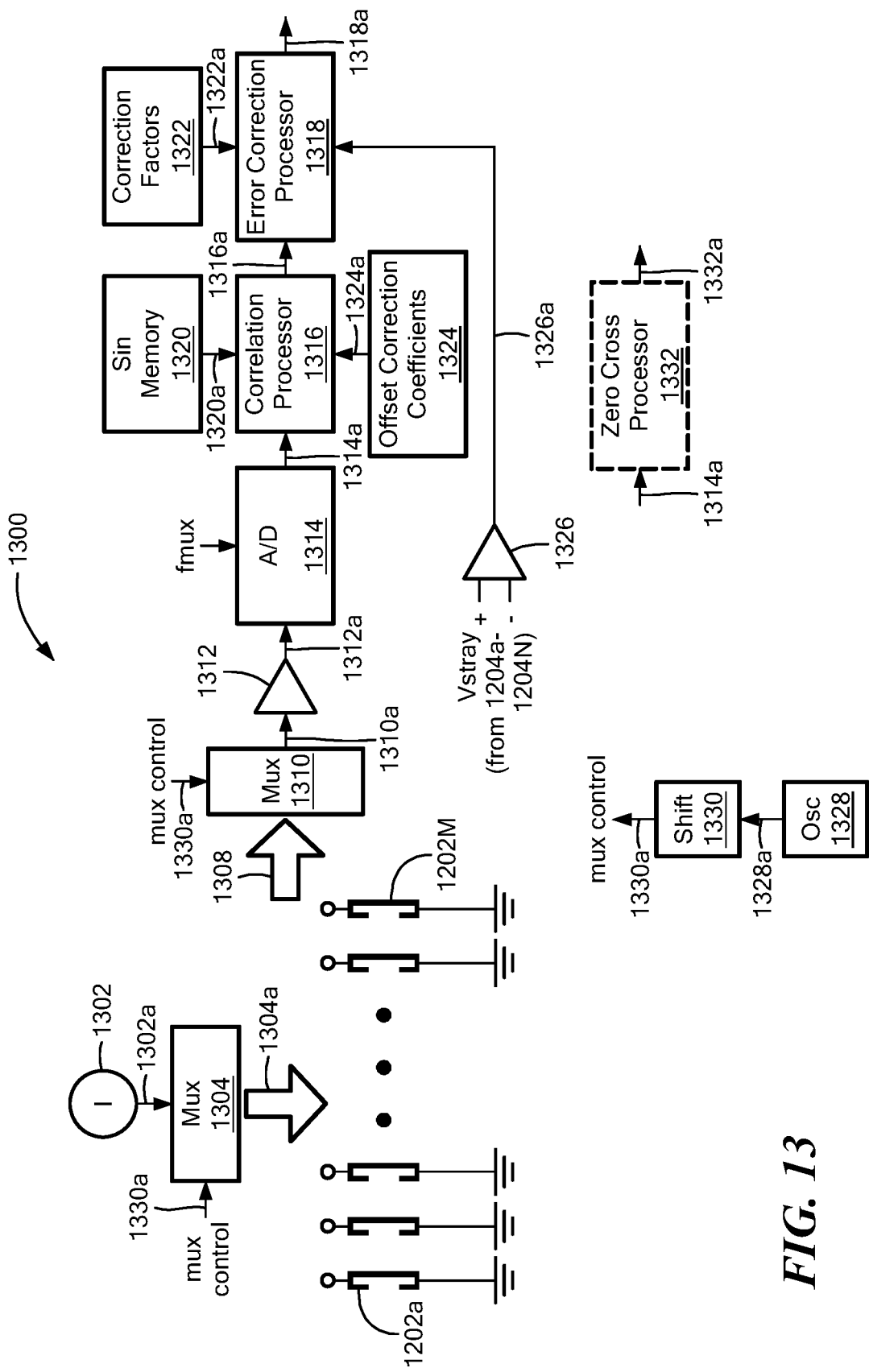
FIG. 13 is a block diagram of an illustrative magnetic field sensor that can include an electronic circuit that can serve as the electronic circuit of FIG. 12.

Referring now to FIG. 13, in which like elements of FIG. 12 are shown having like reference designations, a magnetic field sensor 1300 can include an electronic circuit the same as or similar to the electronic circuit 1206 of FIG. 12 and can include the first plurality of magnetic field sensing elements 1202a-1202M and also include the second plurality of magnetic field sensing elements 1204a-1204N.

An oscillator 1328 can be operable to generate an oscillator signal 1328a coupled, for example, to a shift register 1330. The shift register 1330 can generate a multiplexer control signal 1330a.

A current source 1302 can be operable to generate a current signal 1302a coupled to a multiplexer 1304. The multiplexer 1304 can be operable, under control by the multiplexer control signal 1330a, to provide a current signal 1304a to the first plurality of magnetic field sensing elements 1202a, 1202M, sequentially, one at a time. The sequential control can result in a signal 1308, having samples of signals from the first plurality of magnetic field sensing elements 1202a, 1202M, on separate (parallel) couplings to a multiplexer 1310. The multiplexer 1310 can be operable to generate a serial samples signal 1310a having the samples of the signals one at a time carried on a serial signal channel.

An amplifier 1312 can be coupled to the serial sampled signal 1310a and can be operable to generate an amplified serial sampled signal 1312a. An analog-to-digital converter 1314 can receive the amplified serial sampled signal 1312a and can generate a digital serial sampled signal 1314a having digital samples, one at a time, each with a plurality of digital bit, and each sample carried as a serial set of digital bits or a parallel set of digital bits.

A correlation processor 1316 can be coupled to the digital serial sampled signal 1314a. A sin memory 1320 can store sine values that can be provided as a signal 1320a to the correlation processor 1316.

Offset correction coefficients 1324 can also be provided as offset correction values 1324a to the correlation processor 1316.

In operation, the correlation processor 1316 can use the offset correction values 1324a to remove any DC offsets from the samples of the digital serial sampled signal 1314a. Thereafter the correlation processor 1316 can perform a correlation between the offset corrected digital serial sampled signal 1314a and the sine values. The correlation can generate a phase signal 1316a indicative of a phase of the offset corrected digital serial sampled signal 1314a. Signals are described in FIG. 14 below. However, let it suffice here to say that the calculated phase provides an indication of a position (e.g., a rotation or linear phase angle of spatial cycle represented by the line 324 of FIG. 12) of the target object 316 of FIG. 12 relative to the position of the first plurality of magnetic field sensing elements 1202a-1202M (i.e., an absolute position or absolute angle).

An error correction processor can be coupled to the phase signal 1316a. Stored correction factors 1322 can provide correction factors 1322a to the error correction processor 1318. The error correction processor 1318 can apply the correction factors 1322a to the phase signal to generate a corrected phase signal 1318a better indicative of the position (e.g., the rotation or linear phase angle of spatial period represented by the line 324) of the target object 316 of FIG. 12.

In some embodiments, the offset correction coefficients and the correction factors 1322 are generated and stored during a manufacturing (testing) step used in the production of the magnetic field sensor 1300.

It should be apparent from the above, that the first plurality of magnetic field sensing elements 1202a-1202M can be processed sequentially as individual samples, while the second plurality of magnetic field sensing elements 1204a-1204N is processed together as one combined signal in accordance with the plurality of magnetic field sensing elements 310a-310N of FIG. 5.

While the correlation processor 1316 can generate a phase signal, it should be recognized that there are other circuits and techniques that can be used to identify a phase of the offset corrected digital serial sampled signal 1314a. For example, the correlation processor 1316 can be replaced by a zero crossing processor 1332. The zero crossing processor 1332 can identify a phase of the offset corrected digital serial sampled signal 1314a by identifying zero crossings (or threshold crossings) of the offset corrected digital serial sampled signal 1314a. Signals described below in conjunction with FIG. 14 will make this relationship apparent.

The electronic circuit 1300 can also include an amplifier 1326 to receive a stray field signal, e.g., the stray field signal 504 of FIG. 5. The amplifier 1326 can generate an amplified stray field signal 1326a coupled to the error correction processor 1318. The error correction processor 1318 can be operable to remove the influence of stray magnetic fields within the uncorrected angle signal 1316a, the stray magnetic fields indicated by the amplified stray field signal 1326a.

As a result of the above corrections, the error correction processor 1318 is operable to generate a corrected angle signal 1318a that has angle errors that are reduced from those of the uncorrected angle signal 1316a.

Figure 14:
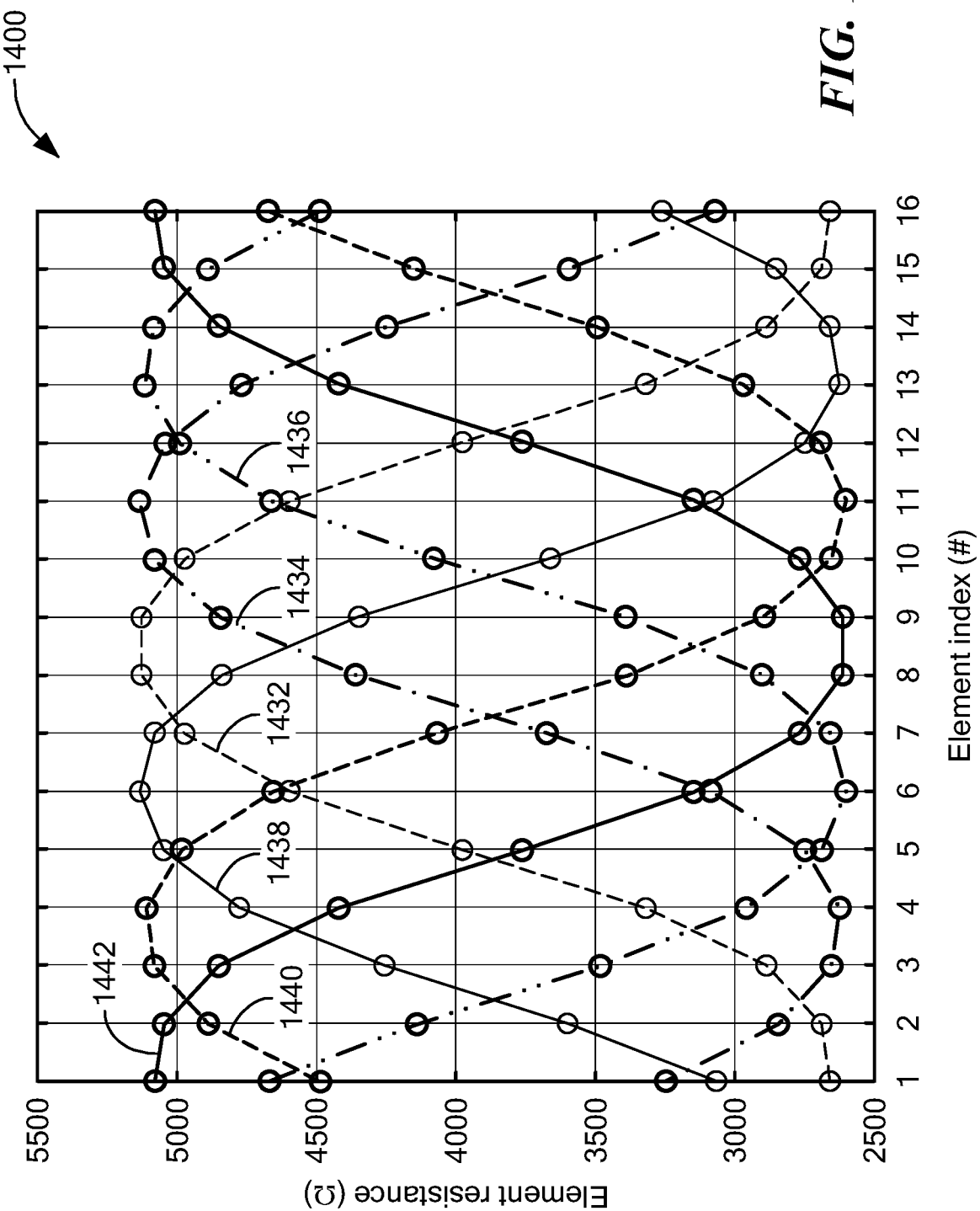
FIG. 14 is a graph showing signals that can be generated by the electronic circuit of FIG. 13.

Referring now to FIG. 14, a graph 1400 has a horizontal axis with a scale in units of element index of the first plurality magnetic field sensing elements 1204a-1204N of FIGS. 12 and 13. The graph 1400 has a vertical axis with a scale in units of resistance in ohms.

Curves 1432, 1434, 1436, 1438, 1440, 1442 are representative of samples (circles) of resistance taken from the first plurality of magnetic field sensing elements 1202a-1202M taken one at a time or at the same time, assuming that there are sixteen magnetic field sensing elements in the first plurality of magnetic field sensing elements 1202a-1202M. The curve 1432 is indicative of a position of the target object 316 of FIG. 12 being at a position relative to the first plurality of magnetic field sensing elements 1202a-1202M of zero degrees (i.e., an absolute position or absolute angle of zero degrees), such that the feature 318 is centered with the first plurality of magnetic field sensing elements 1204a-1204N as shown. Other ones of the curves 1434, 1436, 1438, 1440, 1442 are indicative of other positions, e.g., sixty degrees, one hundred twenty degrees, one hundred eighty degrees, two hundred forty degrees, and three hundred degrees, respectively. Curves following signal samples, e.g., 1310a, 1312a, generated by the magnetic field sensor 1300 of FIG. 13 can be indicative of these and other angles, but others are not shown for clarity.

The curves 1432, 1434, 1436, 1438, 1440, 1442 are corrected to have no DC offset voltage from any of the first plurality of magnetic field sensing elements 1202a-1202M, for example, in accordance with the offset correction coefficients 1324a of FIG. 13.

The curves 1432, 1434, 1436, 1438, 1440, 1442 can be representative of resistance of the first plurality of magnetic field sensing elements 1202a, 1202M for an air gap 315 (FIG. 12) of about 0.5 mm.

From the curves 1432, 1434, 1436, 1438, 1440, 1442, it will be understood that different phases of the curves 1432, 1434, 1436, 1438, 1440, 1442 are indicative of different positions (i.e., rotation angles) of the target object 316. Thus, one position corresponds to one curve like the curves 1432, 1434, 1436, 1438, 1440, 1442.

The correlation processor 1316 described above can be used to identify the phase, and therefore, the position of the target object 316. However, in other embodiments, the zero crossing processor 1332 can be used to identify the phase, merely by finding places on a curve, e.g., 1432, at which the curve passes through a threshold, for example, 3900 Ohms.

Figure 15:
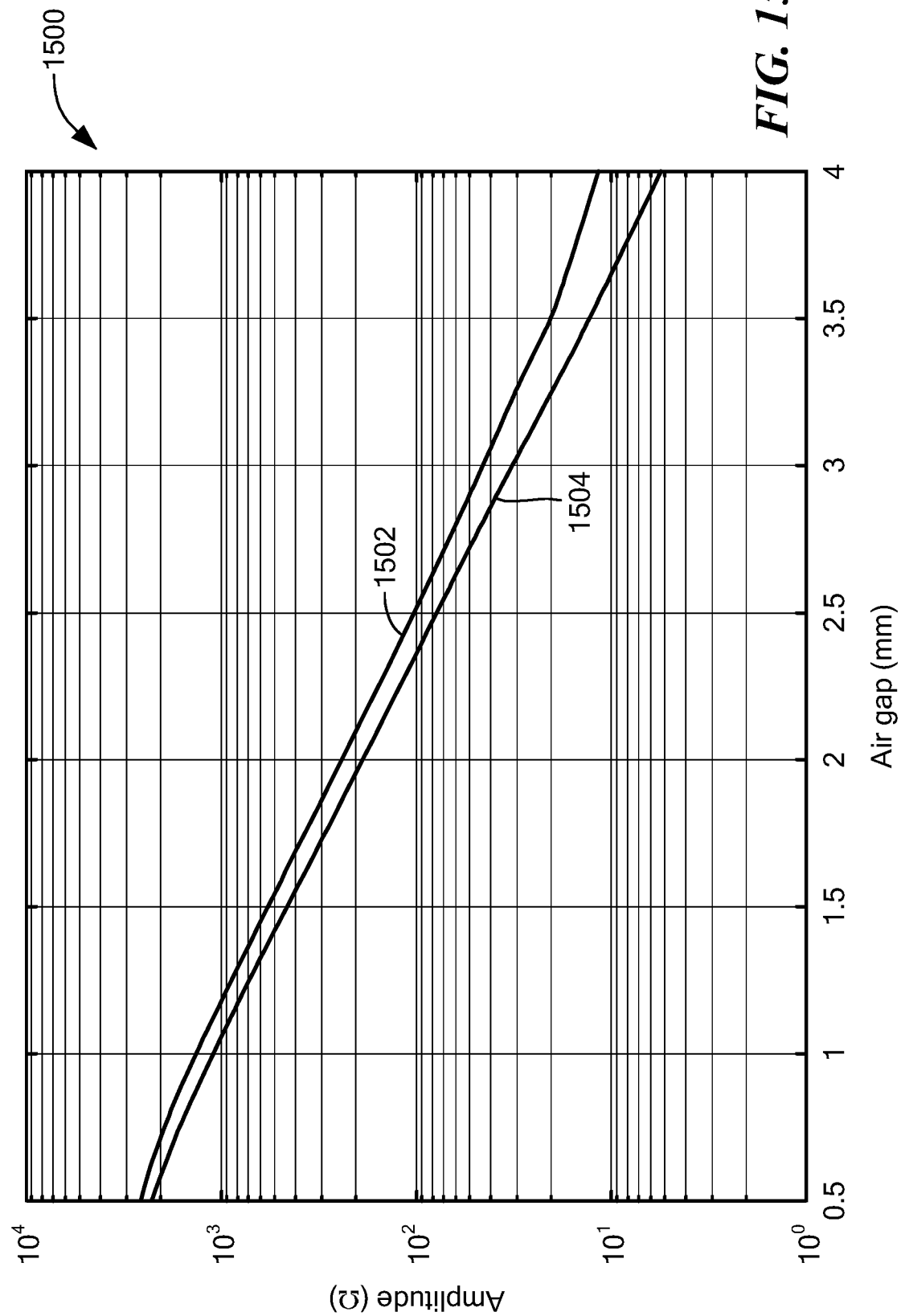
FIG. 15 is a graph showing an influence of an air gap upon signals within the electronic circuit of FIG. 13.

Referring now to FIG. 15, a graph 1500 has a horizontal axis with a scale in units of millimeters pertaining to an air gap, e.g., 315 of FIG. 12, between the first plurality of magnetic field sensing elements 1202a-1202M and the target object 316. The graph 1500 also has a vertical axis with a scale in units of ohms pertaining to resistance of each of the first plurality of magnetic field sensing elements 1202a-1202M.

Curves 1502 and 1504 can be generated by computing the waveforms of FIG. 14 (generated from the first plurality of magnetic field sensing elements 1202a-1202M) for all rotations of the target object 316 and for many air gaps (see, e.g., 315 of FIG. 7) within the indicated range of air gaps. Peak to peak values of these waveform can be computed in the presence of the stray magnetic field in different directions. A largest amplitude and smallest amplitude for each air gap can be computed to arrive at the curves 1502, 1504.

In operation, the correlation processor 1316 can use the curves 1502, 1504 to deduce an air gap based on the amplitude of a measured signal (e.g., 1314a of FIG. 13). The correlation processor 1316 can further compute the amount of period of the target object 316 intercepted by the first plurality of magnetic field sensing elements 1202a-1202M. This value can then be then used in a correlation algorithm used by the correlation processor 1316.

Because the graph 1500 is shown with a logarithmic vertical axis, it should be apparent that the difference between the curve 1502, 1504 is similar in percentage for all air gaps within the indicate range of air gaps.

Figure 16:
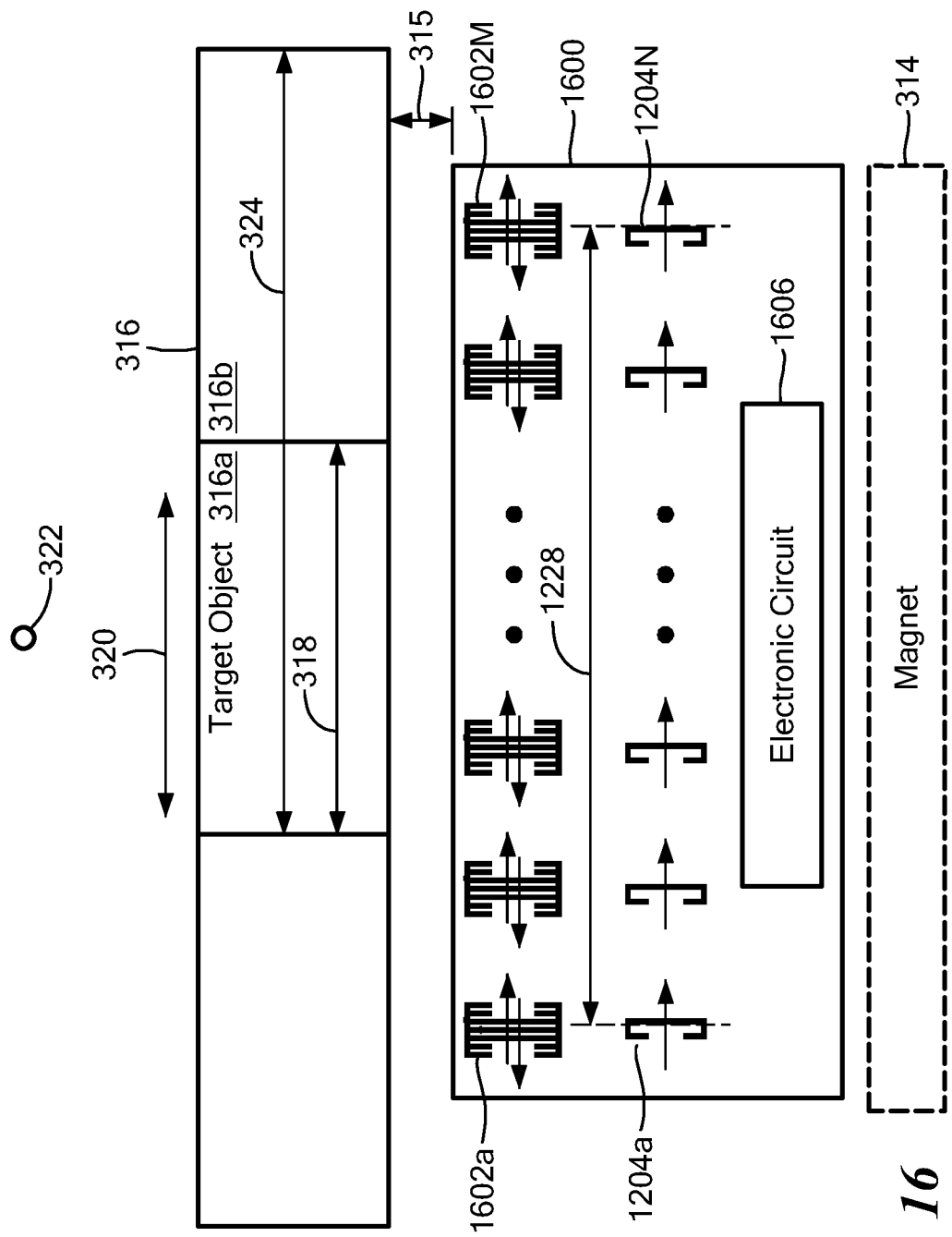
FIG. 16 is a top view of a magnetic field sensor having a plurality of pairs of magnetic field sensing elements for sensing a motion of a target object, a plurality of individual magnetic field sensing elements for sensing a stray magnetic field, and an electronic circuit.

Referring now to FIG. 16, in which like elements of FIGS. 3 and 12 are shown having like reference designations, a magnetic field sensor can include a substrate 1600, for example, a semiconductor substrate. In some embodiments, i.e., back-biased arrangements, the magnetic field sensor can also include the permanent magnet 314 disposed proximate to the substrate 1600.

A first plurality of magnetic field sensing elements 1602a-1602M can be like the first plurality of magnetic field sensing elements 1202a-1202M of FIG. 12. Here however, the first plurality of magnetic field sensing elements 1602a-1602M is arranged in groups of four magnetic field sensing elements with two of each group of four GMR elements having a reference direction (i.e., directional response axis) pointing to the right and two of each group of four magnetic field sensing elements with a reference pointing to the left, here shown to be GMR elements having a yoke shape.

For embodiments in which the first plurality of magnetic field sensing elements 1202a-1202M is comprised of GMR elements, magnetic directions of the reference layers indicated by arrows in two directions are parallel to and in the same direction as directional maximum response axes of the first plurality of magnetic field sensing elements 1602a-1602M.

The directional maximum response axes of the first plurality of magnetic field sensing elements 1602a-1602M can be parallel to each other and can be parallel to the major surface of the substrate 1600. The directional maximum response axes of the first plurality of magnetic field sensing elements 1602a-1602M can be parallel to the direction of motion of the target object 316 indicated by the line 320.

Directional maximum response axes of the second plurality of magnetic field sensing elements 1204a-1204N can be parallel to the maximum response axes of the first plurality of magnetic field sensing elements 1602a-1602M.

The first plurality of magnetic field sensing elements 1602a-1602M can be somewhat insensitive to an influence of the stray (or external) magnetic fields when used in conjunction with magnetic field sensor of 1700 described below in conjunction with FIG. 17 (i.e., the elements 1602a-1602M can be arranged to provide an output that is insensitive to stray fields). In other words, stray fields can affect the curves of FIG. 14 by offsetting and amplifying them.

However, since only the phase of these curves is detected, the output can be insensitive to stray fields. Thus, the second plurality of magnetic field sensing elements 1204a-1204N may not be needed in some embodiments of the magnetic field sensor 1600. However, the first plurality of magnetic field sensing elements 1602a-1602M can still be used in combination with the second plurality of magnetic field sensing elements 1204a-1204N to further improve rejection of influence from stray (or external) magnetic fields.

In other embodiments, the first plurality of GMR elements 1602a-1602M can be replaced by other types of magnetic field sensing element, for example, TMR elements, AMR elements, or vertical Hall effect elements, which also have maximum response axes parallel to the major surface of the substrate 1600.

Figure 17:
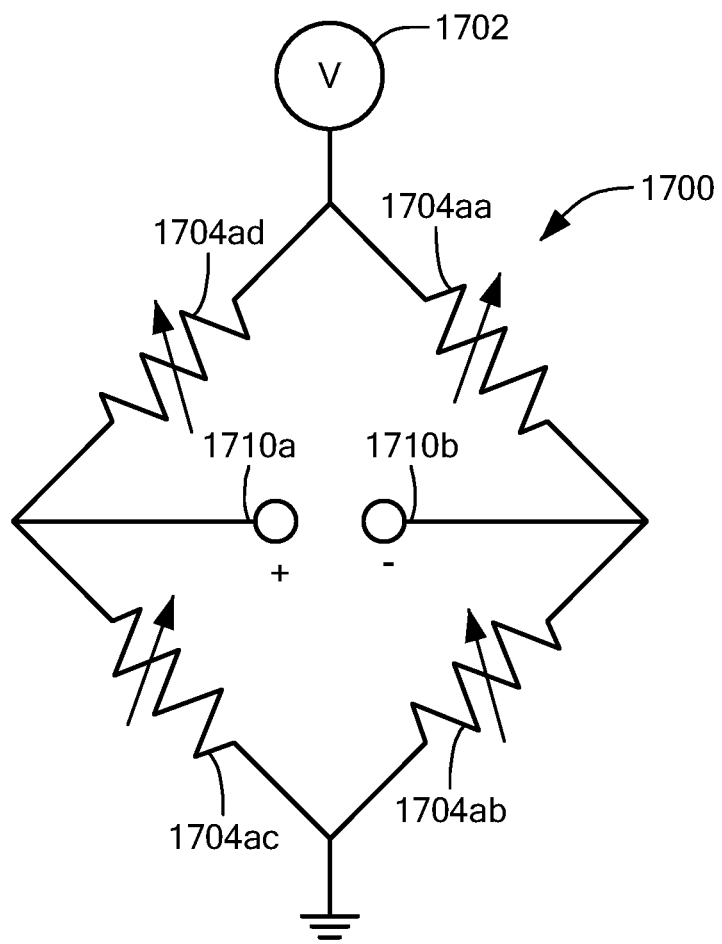
FIG. 17 is a schematic diagram showing one pair of the plurality of pairs of magnetic field sensing elements of FIG. 16, here arranged in a full bridge; with two fixed value resistors.

Referring now to FIG. 17, an electronic circuit 1700 is arranged in a bridge of four magnetic field sensing elements 1704aa, 1704ab, 1704ac, 1704ad, which can be similar to each one of the groups of four of magnetic field sensing elements 1602a-1602M of FIG. 16.

The four magnetic field sensing elements 1704aa, 1704ab, 1704ac, 1704ad can be coupled in a full bridge arrangement between a voltage generator 1702 and ground. The electronic circuit can generate a differential signal 1710a, 1710b.

Figure 18:
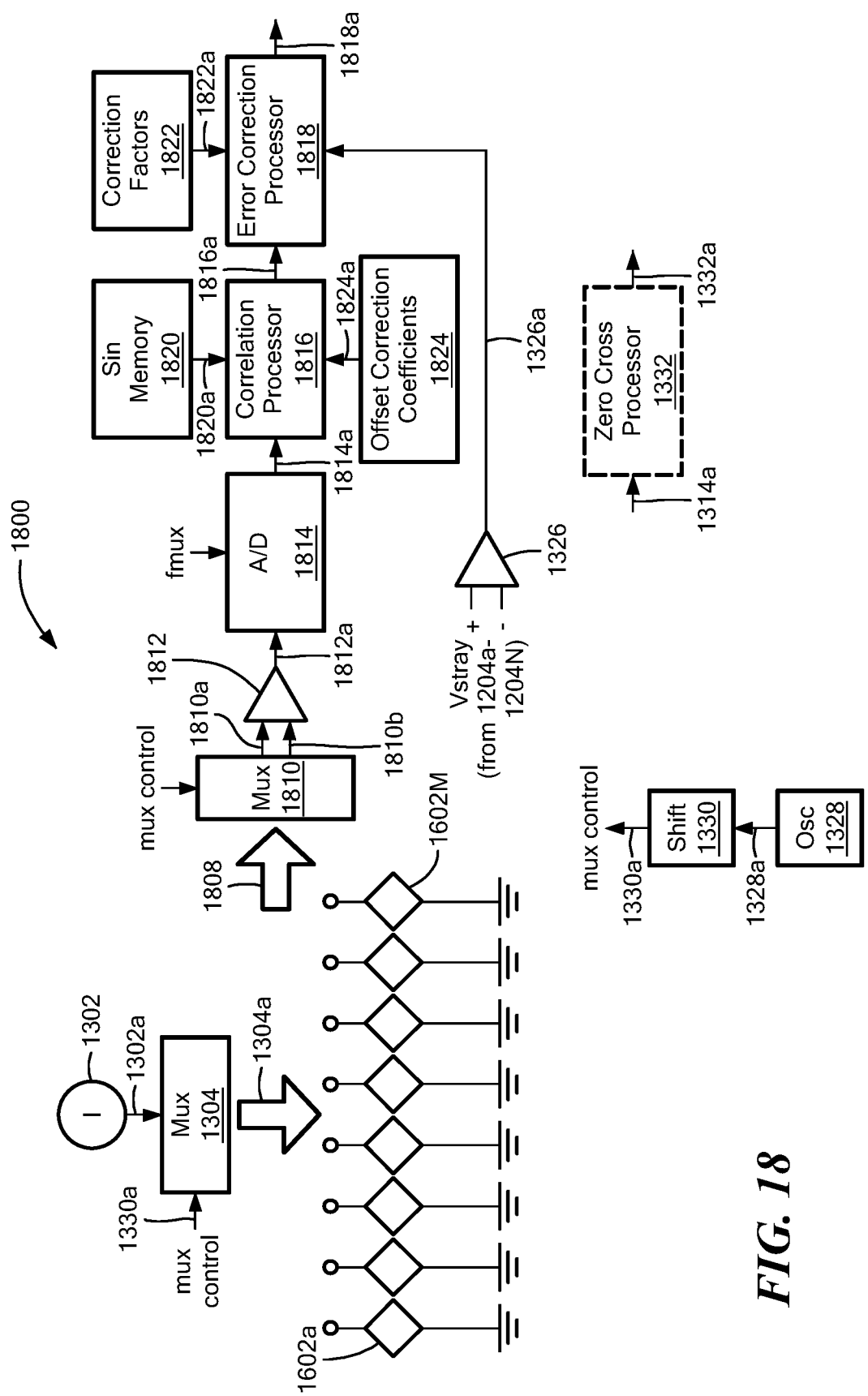
FIG. 18 is a block diagram of an illustrative magnetic field sensor that can have an electronic circuit that can serve as the electronic circuit of FIG. 16.

Referring now to FIG. 18, in which like elements of FIGS. 12, 13, and 16 are shown having like reference designations, a magnetic field sensor 1800 can include an electronic circuit the same as or similar to the electronic circuit 1606 of FIG. 16 and can include the first plurality of magnetic field sensing elements 1602a-1602M and also include the second plurality of magnetic field sensing elements 1204a, 1204N.

Other elements of FIG. 18 are similar elements of FIG. 13, but are here shown with different reference designators in order to distinguish them as slightly different due to differential signals 1808, and 1810a, 1810b generated by the first plurality of magnetic field sensing elements 1602a-1602N. Thus, the magnetic field sensor 1800 is similar to the magnetic field sensor 1300 of FIG. 13 and is not discussed again here.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor responsive to a target object having a plurality of target features arranged in a periodic pattern, the periodic pattern having a spatial period with a width y, the target object capable of moving such that the target features move along a movement direction relative to the magnetic field sensor, the magnetic field sensor comprising:
 a substrate having a surface;
 a first plurality of magnetic field sensing elements disposed upon the substrate, the first plurality of magnetic field sensing elements comprising x magnetic field sensing elements, each having a respective maximum response axis parallel to a common axis and parallel to the surface of the substrate, the first plurality of magnetic field sensing elements arranged in a line parallel to the movement direction, wherein a distance between centers of outer ones of the first plurality of magnetic field sensing elements is $y(1-1/x)$, wherein the first plurality of magnetic field sensing elements is electrically coupled in a single series arrangement resulting in a series string signal; and
 one or more magnetic field sensing elements disposed on the substrate and not included in the first plurality of magnetic field sensing elements, each having a respective maximum response axis parallel to the common axis and parallel to the surface of the substrate, the one or more magnetic field sensing elements operable to generate a movement signal responsive to the movement of the target object, wherein the movement signal comprises a first error signal component.

2. The magnetic field sensor of claim 1, wherein all adjacent pairs of the plurality of magnetic field sensing elements are equally spaced.

3. The magnetic field sensor of claim 1, wherein the series string signal does not substantially respond to the movement of the target object.

4. The magnetic field sensor of claim 3, further comprising:
 a second plurality of magnetic field sensing elements disposed upon the substrate, a first one of the second plurality of magnetic field sensing elements having a first reference layer with a first magnetic direction, a second one of the second plurality of magnetic field sensing elements having a second magnetic layer with a second magnetic direction orthogonal to the first magnetic direction, a third one of the second plurality of magnetic field sensing elements having a third reference layer with a third magnetic direction opposite to the first magnetic direction, and a fourth one of the second plurality of magnetic field sensing elements having a fourth reference layer with a fourth magnetic direction opposite to the second magnetic direction, the second plurality of magnetic field sensing elements arranged in a first line perpendicular to the movement direction; and
 a third plurality of magnetic field sensing elements disposed upon the substrate, a first one of the third plurality of magnetic field sensing elements having a fifth reference layer with a fifth magnetic direction, a second one of the third plurality of magnetic field sensing elements having a sixth magnetic layer with a sixth magnetic direction orthogonal to the fifth magnetic direction, a third one of the third plurality of magnetic field sensing elements having a seventh reference layer with a seventh magnetic direction opposite to the fifth magnetic direction, and a fourth one of the third plurality of magnetic field sensing elements having an eighth reference layer with an eighth magnetic direction opposite to the sixth magnetic direction, the third plurality of magnetic field sensing elements arranged in a second line perpendicular to the movement direction and parallel to the first line.

5. The magnetic field sensor of claim 4, wherein the first plurality of magnetic field sensing elements comprises a first plurality of magnetoresistance elements, and wherein the second plurality of magnetic field sensing elements comprises a second plurality of magnetoresistance elements.

6. The magnetic field sensor of claim 4, wherein the first plurality of magnetic field sensing elements comprises a first plurality of vertical Hall elements, and wherein the second plurality of magnetic field sensing elements comprises a second plurality of vertical Hall elements.

7. The magnetic field sensor of claim 3, further comprising:
three or more magnetic field sensing elements disposed upon the substrate and not included in the first plurality of magnetic field sensing elements, each having a respective reference layer with a respective reference magnetic direction, the reference magnetic directions of the three or more magnetic field sensing elements parallel to the common axis and parallel to the surface of the substrate, the three or more magnetic field sensing elements arranged in a line parallel to the movement direction, wherein the three or more magnetic field sensing elements are electrically energized in a sequential pattern resulting in a separate time multiplexed signals representative of sequential signals generated by the three or more magnetic field sensing elements.

8. The magnetic field sensor of claim 7, wherein the first plurality of magnetic field sensing elements comprises a first plurality of magnetoresistance elements, and wherein the three or more magnetic field sensing elements comprises three or more magnetoresistance elements.

9. The magnetic field sensor of claim 7, wherein the first plurality of magnetic field sensing elements comprises a first plurality of vertical Hall elements, and wherein the three or more magnetic field sensing elements comprises three or more vertical Hall elements.

10. The magnetic field sensor of claim 1, further comprising:
a correction processor coupled to receive the movement signal, coupled to receive the series string signal, and operable to generate a magnetic field sensor signal having a second error signal component smaller than the first error signal component.

11. The magnetic field sensor of claim 1, wherein the one or more magnetic field sensing elements comprises eight magnetic field sensing elements, a first four of the eight magnetic field sensing elements electrically coupled in a first bridge and a second four of the eight magnetic field sensing elements coupled in a second bridge.

12. The magnetic field sensor of claim 11, wherein the first bridge is operable to generate a first signal in response to the movement of the target object and the second bridge is operable to generate a second signal in response to the movement of the target object, wherein the first and second signals are orthogonal to each other.

13. The magnetic field sensor of claim 12, further comprising:
an arctangent processor coupled to receive the first and second signals and operable to generate an angle signal indicative of an angle of the movement of the target object, wherein the movement signal corresponds to an angle signal, and wherein the first error signal component corresponds to a first angle error component.

14. The magnetic field sensor of claim 13, further comprising:
a correction processor coupled to receive the angle signal, coupled to receive the series string signal and operable to generate a magnetic field sensor signal having a second angle error component smaller than the first angle error component.

15. The magnetic field sensor of claim 1, wherein the target object comprises a ferromagnetic target object.

16. The magnetic field sensor of claim 15, further comprising:
a two pole magnet disposed proximate to the substrate.

17. The magnetic field sensor of claim 1, wherein the target object comprises a circular magnet having two or more poles.

18. The magnetic field sensor of claim 1, wherein the first plurality of magnetic field sensing elements comprises a first plurality of magnetoresistance elements.

19. The magnetic field sensor of claim 1, wherein the first plurality of magnetic field sensing elements comprises a first plurality of vertical Hall elements.

20. A magnetic field sensor responsive to a target object having a plurality of target features arranged in a periodic pattern, the periodic pattern having a spatial period, the target object capable of moving such that the target features move along a movement direction relative to the magnetic field sensor, the magnetic field sensor comprising:
a substrate having a surface;
a first plurality of magnetic field sensing elements disposed upon the substrate, a first one of the first plurality of magnetic field sensing elements having a first reference layer with a first magnetic direction, a second one of the first plurality of magnetic field sensing elements having a second magnetic layer with a second magnetic direction orthogonal to the first magnetic direction, a third one of the first plurality of magnetic field sensing elements having a third reference layer with a third magnetic direction opposite to the first magnetic direction, and a fourth one of the first plurality of magnetic field sensing elements having a fourth reference layer with a fourth magnetic direction opposite to the second magnetic direction, the first plurality of magnetic field sensing elements arranged in a first line perpendicular to the movement direction; and
a second plurality of magnetic field sensing elements disposed upon the substrate, a first one of the second plurality of magnetic field sensing elements having a fifth reference layer with a fifth magnetic direction, a second one of the second plurality of magnetic field sensing elements having a sixth magnetic layer with a sixth magnetic direction orthogonal to the fifth magnetic direction, a third one of the second plurality of magnetic field sensing elements having a seventh reference layer with a seventh magnetic direction opposite to the fifth magnetic direction, and a fourth one of the second plurality of magnetic field sensing elements having an eighth reference layer with an eighth magnetic direction opposite to the sixth magnetic direction, the second plurality of magnetic field sensing elements arranged in a second line perpendicular to the movement direction and parallel to the first line.

21. The magnetic field sensor of claim 20, wherein the first plurality of magnetic field sensing elements comprises a first plurality of magnetoresistance elements, and wherein the second plurality of magnetic field sensing elements comprises a second plurality of magnetoresistance elements.

22. The magnetic field sensor of claim 20, wherein the first plurality of magnetic field sensing elements comprises a first plurality of vertical Hall elements, and wherein the second plurality of magnetic field sensing elements comprises a second plurality of vertical Hall elements.

23. A magnetic field sensor responsive to a target object having a plurality of target features arranged in a periodic pattern, the periodic pattern having a spatial period, the target object capable of moving such that the target features move along a movement direction relative to the magnetic field sensor, the magnetic field sensor comprising:
  a substrate having a surface; and
  three or more magnetic field sensing elements disposed upon the substrate, each having a respective reference layer with a respective reference magnetic direction, the reference magnetic directions of the three or more magnetic field sensing elements parallel to a common axis and parallel to the surface of the substrate, the three or more magnetic field sensing elements arranged in a line parallel to the movement direction, wherein the three or more magnetic field sensing elements are electrically energized in a sequential pattern resulting in separate time multiplexed signals representative of sequential signals generated by the three or more magnetic field sensing elements.

24. The magnetic field sensor of claim 23, wherein the three or more magnetic field sensing elements comprises three or more magnetoresistance elements.

25. The magnetic field sensor of claim 23, wherein the three or more magnetic field sensing elements comprises three or more vertical Hall elements.

26. A magnetic field sensor responsive to a target object having a plurality of target features arranged in a periodic pattern, the periodic pattern having a spatial period with a width y, the target object capable of moving such that the target features move along a movement direction relative to the magnetic field sensor, the magnetic field sensor comprising:
  a substrate having a surface;
  a first plurality of magnetic field sensing elements disposed upon the substrate, the first plurality of magnetic field sensing elements comprising x magnetic field sensing elements, each having a respective maximum response axis parallel to a common axis and parallel to the surface of the substrate, the first plurality of magnetic field sensing elements arranged in a line parallel to the movement direction, wherein a distance between centers of outer ones of the first plurality of magnetic field sensing elements is $y(1-1/x)$, wherein the first plurality of magnetic field sensing elements is electrically coupled in a single series arrangement resulting in a series string signal, wherein the series string signal does not substantially respond to the movement of the target object, and
  three or more magnetic field sensing elements disposed upon the substrate and not included in the first plurality of magnetic field sensing elements, each having a respective reference layer with a respective reference magnetic direction, the reference magnetic directions of the three or more magnetic field sensing elements parallel to the common axis and parallel to the surface of the substrate, the three or more magnetic field sensing elements arranged in a line parallel to the movement direction, wherein the three or more magnetic field sensing elements are electrically energized in a sequential pattern resulting in a separate time multiplexed signals representative of sequential signals generated by the three or more magnetic field sensing elements.

27. The magnetic field sensor of claim 26, wherein the first plurality of magnetic field sensing elements comprises a first plurality of magnetoresistance elements, and wherein the three or more magnetic field sensing elements comprises three or more magnetoresistance elements.

28. The magnetic field sensor of claim 26, wherein the first plurality of magnetic field sensing elements comprises a first plurality of vertical Hall elements, and wherein the three or more magnetic field sensing elements comprises three or more vertical Hall elements.

* * * * *

UNITED STATES PATENT AND TRADEMARK OFFICE
CERTIFICATE OF CORRECTION

PATENT NO. : 11,327,127 B2  
APPLICATION NO. : 16/507560  
DATED : May 10, 2022  
INVENTOR(S) : Rémy Lassalle-Balier et al.

Page 1 of 4

It is certified that error appears in the above-identified patent and that said Letters Patent is hereby corrected as shown below:

On the Title Page

Column 2, ABSTRACT, Line 4 delete "equal a" and replace with --equal to a--.

In the Specification

Column 2, Line 11 delete "and output" and replace with --an output--.

Column 2, Line 19 delete "can a" and replace with --can have a--.

Column 3, Line 35 delete "an fourth" and replace with --a fourth--.

Column 5, Line 23 delete "type I-V" and replace with --type III-V--.

Column 6, Line 52 delete "replace" and replace with --replaced--.

Column 6, Line 53 delete "elements" and replace with --element--.

Column 8, Line 1 delete ", 303," and replace with --, 304,--.

Column 8, Line 6 delete "to maximum" and replace with --to the maximum--.

Column 8, Line 17 delete "element" and replace with --elements--.

Column 8, Line 20 delete "have maximum" and replace with --have a maximum--.

Column 8, Line 22 delete ", 303," and replace with --, 304,--.

Column 8, Line 25 delete ", 303," and replace with --, 304,--.

Signed and Sealed this  
Twentieth Day of June, 2023

Katherine Kelly Vidal  
*Director of the United States Patent and Trademark Office*

CERTIFICATE OF CORRECTION (continued)
U.S. Pat. No. 11,327,127 B2

Column 8, Line 50 delete ", 303," and replace with --, 304,--.

Column 8, Line 56 delete "301a-310N" and replace with --310a-310N--.

Column 9, Line 46 delete "310a-301N" and replace with --310a-310N--.

Column 9, Line 50 delete "plurality magnetic" and replace with --plurality of magnetic--.

Column 9, Line 60 delete "position the" and replace with --position of the--.

Column 9, Line 63 delete "in" and replace with --is--.

Column 9, Line 65 delete "of magnetic" and replace with --of the magnetic--.

Column 11, Line 41 delete "element" and replace with --elements--.

Column 11, Line 57 delete "on half" and replace with --one half--.

Column 12, Line 25 delete "element" and replace with --elements--.

Column 12, Line 50 delete "substrate 702." and replace with --substrate 700.--.

Column 12, Line 57 delete "object 716" and replace with --object 316--.

Column 13, Line 47 delete "1002" and replace with --1020--.

Column 14, Line 29 delete "values 110a," and replace with --values 1110a,--.

Column 14, Line 51 delete "signal 108a" and replace with --signal 1108a--.

Column 15, Line 27 delete "element," and replace with --elements,--.

Column 15, Line 35 delete "element," and replace with --elements,--.

Column 15, Line 63 delete "the first plurality of the first plurality" and replace with --the first plurality--.

Column 15, Line 65 delete "can removed" and replace with --can be removed--.

Column 16, Line 10 delete "1204a-1202M." and replace with --1204a-1204N--.

Column 16, Line 13 delete "1201a-1210N" and replace with --1204a-1204N--.

Column 16, Line 28 delete "substrate 1202." and replace with --substrate 1200.--.

Column 16, Line 32 delete "1210a-1210N." and replace with --1204a-1204N.--.

CERTIFICATE OF CORRECTION (continued)
U.S. Pat. No. 11,327,127 B2

Column 16, Line 52 delete "1210a-1210N." and replace with --1204a-1204N.--.

Column 16, Line 57 delete "1210a-1210N." and replace with --1204a-1204N.--.

Column 16, Line 62 delete "plurality magnetic" and replace with --plurality of magnetic--.

Column 17, Line 9 delete "of magnetic" and replace with --of the magnetic--.

Column 17, Line 19 delete "1202a-1204N." and replace with --1204a-1204N.--.

Column 17, Line 23 delete "1202a-1204N." and replace with --1204a-1204N.--.

Column 17, Line 25 delete "1202a-1204N." and replace with --1204a-1204N.--.

Column 17, Line 28 delete "describe" and replace with --described--.

Column 17, Line 33 delete "1202a-1204N." and replace with --1204a-1204N.--.

Column 17, Line 37 delete "sensor of 1300" and replace with --sensor 1300--.

Column 17, Line 49 delete "1204a, 1204N." and replace with --1204a-1204N.--.

Column 17, Line 67 delete "1202a, 1202M," and replace with --1202a-1202M--.

Column 18, Line 3 delete "1202a, 1202M," and replace with --1202a-1202M--.

Column 18, Line 5 delete "samples" and replace with --sampled--.

Column 18, Line 14 delete "bit," and replace with --bits,--.

Column 18, Line 35 delete "of spatial" and replace with --of the spatial--.

Column 18, Line 45 delete "of spatial" and replace with --of the spatial--.

Column 19, Line 19 delete "plurality magnetic" and replace with --plurality of magnetic--.

Column 19, Line 49 delete "1202a, 1202M" and replace with --1202a-1202M--.

Column 20, Line 9 delete "waveform" and replace with --waveforms--.

Column 20, Line 19 delete "then be then used" and replace with --then be used--.

Column 20, Line 23 delete "curve" and replace with --curves--.

Column 20, Line 24 delete "indicate" and replace with --indicated--.

CERTIFICATE OF CORRECTION (continued)
U.S. Pat. No. 11,327,127 B2

Column 20, Line 40 delete "reference pointing" and replace with --reference direction pointing--.

Column 20, Line 63 delete "sensor of 1700" and replace with --sensor 1700--.

Column 21, Line 12 delete "element," and replace with --elements,--.

Column 21, Line 19 delete "of four of" and replace with --of four--.

In the Claims

Column 23, Line 22 in Claim 7, delete "in a" and replace with --in--.

Column 26, Line 23 in Claim 26, delete "in a" and replace with --in--.